US008261762B2

(12) United States Patent
Komiyama et al.

(10) Patent No.: US 8,261,762 B2
(45) Date of Patent: Sep. 11, 2012

(54) PROCESSING GAS SUPPLYING SYSTEM AND PROCESSING GAS SUPPLYING METHOD

(75) Inventors: Kiyoshi Komiyama, Tokyo (JP); Akitoshi Tsuji, Tokyo (JP); Takuya Fujiwara, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 658 days.

(21) Appl. No.: 12/093,491

(22) PCT Filed: Aug. 10, 2007

(86) PCT No.: PCT/JP2007/065709

§ 371 (c)(1),
(2), (4) Date: May 13, 2008

(87) PCT Pub. No.: WO2008/032516

PCT Pub. Date: Mar. 20, 2008

(65) Prior Publication Data

US 2009/0170332 A1 Jul. 2, 2009

(30) Foreign Application Priority Data

Sep. 15, 2006 (JP) ................................ 2006-251011

(51) Int. Cl.
*H01L 21/30* (2006.01)
*B05C 11/00* (2006.01)

(52) U.S. Cl. ... 137/15.04; 137/240; 134/1.3; 134/22.19; 438/905

(58) Field of Classification Search .................. 137/240, 137/15.04, 15.05; 134/1.3, 166 C, 22.19; 438/905, 906
See application file for complete search history.

(56) References Cited

U.S. PATENT DOCUMENTS

| | | | | |
|---|---|---|---|---|
| 4,917,136 | A * | 4/1990 | Ohmi et al. | 137/15.04 |
| 7,334,595 | B2 * | 2/2008 | Birtcher et al. | 137/15.04 |
| 7,406,979 | B2 * | 8/2008 | Wodjenski et al. | 137/240 |
| 7,798,168 | B2 * | 9/2010 | Olander et al. | 137/486 |

FOREIGN PATENT DOCUMENTS

| | | | |
|---|---|---|---|
| JP | 01-225320 | A | 9/1989 |
| JP | 01-281138 | A | 11/1989 |
| JP | 2002-511133 | A | 4/2002 |
| JP | 2003-014193 | A | 1/2003 |
| JP | 2004-169123 | A | 6/2004 |

* cited by examiner

*Primary Examiner* — Kevin Lee
(74) *Attorney, Agent, or Firm* — Pearne & Gordon LLP

(57) ABSTRACT

A gas supplying system includes a processing gas supply pipe for supplying a processing gas from a gas cylinder 210 into a processing apparatus and a nonreactive gas supply source 230 for supplying a nonreactive gas into the gas supply pipe. While the system is in operation, the gas supply pipe is charged with the nonreactive gas and a control unit is in a standby state. If a processing gas use start signal is received from the processing apparatus, the system exhausts the non-reactive gas from the gas supply pipe to create a vacuum therein; charges the gas supply pipe with the processing gas; and starts a supply of the processing gas from the processing gas supply source. If a processing gas use finish signal is received from the processing apparatus, the system stops the supply of the processing gas from the processing gas supply source; exhausts the processing gas from the gas supply pipe to create a vacuum therein; and charges the gas supply pipe with the nonreactive gas. Accordingly, the gas pipe from the processing gas supply source to the processing apparatus can be kept charged with the nonreactive gas when the processing gas is not used in the processing apparatus. Therefore, a deposit generation inside the gas pipe can be prevented during that period.

22 Claims, 14 Drawing Sheets

PROCESSING GAS SUPPLYING SYSTEM AND PROCESSING GAS SUPPLYING METHOD

TECHNICAL FIELD

The present invention relates to a processing gas supplying system and a processing gas supplying method for supplying a processing gas into a processing apparatus.

BACKGROUND ART

A variety of processing apparatuses such as a heat treating apparatus, a film forming apparatus, an etching apparatus, and so forth are disposed in a semiconductor manufacturing factory. Since various kinds of processing gases are used in these processing apparatuses, disposed in the factory is a gas supplying apparatus for supplying the processing gases stored in gas cylinders, i.e., processing gas supply sources, into the processing apparatuses via gas pipes. Further, in place of the gas cylinders, a gas generating device equipped with an electrolytic cell may be used as a processing gas supply source (see, for example, Patent Reference 1: Japanese Patent Laid-open Application No. 2004-169123).

The gas pipe of the gas supplying apparatus is connected to a gas box installed in each processing apparatus. When necessary, the gas box opens a gas inlet valve to introduce a processing gas from the gas pipe of the gas supplying apparatus and then supplies the processing gas into a processing chamber of the processing apparatus while controlling a flow rate of the processing gas via a flow rate controller such as a mass flow controller (MFC) or the like.

Conventionally, while the gas supplying apparatus is under operation, the gas pipe of the gas supplying apparatus is always maintained charged with a processing gas so that the processing gas is ready to be used at any time, except for exceptional occasions that a gas cylinder is being replaced (see, for example, Patent Reference 2: Japanese Patent Laid-open Application No. 2003-14193) or a gas leakage takes place. Accordingly, when the processing apparatus needs to use the processing gas, the processing gas can be immediately introduced into the processing chamber by opening the gas inlet valve of the gas box, thus carrying out a desired process on, for example, a wafer.

Moreover, if the wafer process by the processing apparatus is completed, the gas inlet valve of the gas box is closed to stop the supply of the processing gas. Then, after performing loading/unloading of the wafer and/or adjustment of inner condition of the processing chamber, the gas inlet valve of the gas box is opened again so that the processing gas is introduced into the processing chamber.

DISCLOSURE OF THE INVENTION

Problems to be Solved by the Invention

Conventionally, however, since the gas pipe of the gas supplying apparatus is always maintained filled with the processing gas while the gas supplying apparatus is being operated, as mentioned above, a contact time between the processing gas and a metal forming the gas pipe of the gas supplying apparatus is very long. As a result, depending on the kind of the processing gas involved (for example, a reactive gas such as a HF gas or the like), the processing gas may react with the metal of the gas pipe, resulting in an accumulation of undesired deposits (for example, a metal fluoride) on an inner wall of the gas pipe.

Such a deposit generation inside the gas pipe depends on whether the processing gas is being used in the processing apparatus or not. For example, when the processing gas is being used on the side of the processing apparatus as in the case of performing the wafer process in the processing chamber, there is little likelihood that a deposit generation takes place as the processing gas flows in the gas pipe of the gas supplying apparatus continuously. However, when the processing gas is not used on the side of the processing apparatus after the wafer process is completed in the processing chamber and before a next wafer process is started, for example, the processing gas would stay in the gas pipe of the gas supplying apparatus, during which deposits are highly likely to be accumulated on the inner wall of the gas pipe.

Conventionally, since the gas pipe of the processing gas supplying apparatus is kept charged with the processing gas even when the processing gas is not used on the side of the processing apparatus, deposits are highly likely to be accumulated on the inner wall of the gas pipe during that period. Thus, when the gas inlet valve is opened on the side of the processing apparatus later, the deposits may be peeled off from the inner wall of the gas pipe and swept into the processing chamber along with the processing gas, causing a contamination problem such as a particle generation, a problem of internal leakage in for example, a valve, and the like.

Furthermore, Patent References 1 and 2 disclose exhausting a HF gas from the inside of a part of gas pipes and introducing a nonreactive gas thereinto to replace the gas cylinder or prevent a backflow of an electrolytic bath. However, since other gas pipes are always filled with the processing gas, there is still a high likelihood that deposits would be accumulated on the inner walls of the gas pipes due to the stay of the processing gas therein, as in the conventional case mentioned above.

For example, Patent Reference 1 discloses a fluorine gas generating apparatus serving as a processing gas supply source when a fluorine gas is used as a processing gas, wherein the fluorine gas generating apparatus generates the fluorine gas by introducing a HF gas into an electrolytic cell through a gas inlet valve (first auto-valve). This fluorine gas generating apparatus substitutes a residual gas only in a part of gas pipes on the side of the electrolytic cell (gas pipes downstream of the gas inlet valve) with a nonreactive gas to prevent a backflow of the electrolytic bath from the electrolytic cell that might occur when the supply of the HF gas is stopped. However, in this fluorine gas generating apparatus, gas pipes upstream of the gas inlet valve are always charged with the HF gas so that the HF gas can be supplied into the electrolytic cell at any time required by opening the gas inlet valve. Accordingly, as in the conventional case, the processing gas stays in the gas pipes, raising a likelihood of deposit accumulation on the inner wall of the gas pipes.

Further, described in Patent Reference 2 is a method of exhausting the inside of only the gas pipes (primary pipes) connected to the gas cylinder side and introducing a nonreactive gas thereinto when there is a need to separate the gas cylinder from the gas pipes for their replacement. However, if the nonreactive gas is supplied only into the primary pipes, downstream gas pipes including secondary pipes are maintained charged with the processing gas all the time. As a result, deposit accumulation on the inner wall of the gas pipes would easily take place due to the stay of the processing gas therein, as in the conventional case.

In view of the foregoing, it is an object of the present invention to provide a gas supplying system and a gas supplying method capable of preventing a deposit generation in a gas pipe ranging from a processing gas supply source to a processing apparatus by charging the gas pipe with a nonreactive gas, thus suppressing deposits from entering the processing apparatus.

Means for Solving the Problems

In order to accomplish the object, in accordance with one aspect of the present invention, there is provided a gas supplying system for supplying a processing gas (a gas such as a HF gas or the like, having a high reactivity with a metal forming a gas pipe) to a processing apparatus including: a processing gas supply source for supplying the processing gas; a gas supply pipe for supplying the processing gas from the processing gas supply source into the processing apparatus; a nonreactive gas supply source for supplying a nonreactive gas (a gas such as a $N_2$ gas or the like, which does not react with the metal forming the gas pipe) into the gas supply pipe; a vacuum evacuation unit for evacuating the inside of the gas supply pipe to vacuum; and a control unit for receiving a signal from the processing apparatus and controlling an inner state of the gas supply pipe in response to the received signal, wherein the control unit keeps the gas supply pipe charged with the nonreactive gas to be in a standby state while the system is in operation; the control unit exhausts, if a processing gas use start signal is received from the processing apparatus, the nonreactive gas from the gas supply pipe to create a vacuum therein, charges the gas supply pipe with the processing gas, and starts a supply of the processing gas from the processing gas supply source; and the control unit stops, if a processing gas use finish signal is received from the processing apparatus, the supply of the processing gas from the processing gas supply source, exhausts the processing gas from the gas supply pipe to create a vacuum therein, and charges the gas supply pipe with the nonreactive gas.

In order to accomplish the object, in accordance with another aspect of the present invention, there is provided a gas supplying method of a gas supplying system for supplying a processing gas (for example, a HF gas) to a processing apparatus, the gas supplying system including a processing gas supply source for supplying the processing gas; a gas supply pipe for supplying the processing gas from the processing gas supply source into the processing apparatus; a nonreactive gas supply source for supplying a nonreactive gas (for example, a $N_2$ gas) into the gas supply pipe; a vacuum evacuation unit for evacuating the inside of the gas supply pipe to vacuum; and a control unit for receiving a signal from the processing apparatus and controlling an inner state of the gas supply pipe in response to the received signal, the method including: keeping the gas supply pipe charged with the nonreactive gas to be in a standby state while the system is in operation; exhausting, if the control unit receives a processing gas use start signal from the processing apparatus, the nonreactive gas from the gas supply pipe to create a vacuum therein by the vacuum evacuation unit, charging the gas supply pipe with the processing gas supplied from the processing gas supply source, and then starting a supply of the processing gas from the processing gas supply source; and stopping, if the control unit receives a processing gas use finish signal from the processing apparatus, the supply of the processing gas from the processing gas supply source, exhausting the processing gas from the gas supply pipe to create a vacuum therein by the vacuum evacuation unit, and then charging the gas supply pipe with the nonreactive gas supplied from the nonreactive gas supply source.

In accordance with the present invention described above, only when the processing gas is being used in the processing apparatus, the gas supply pipe can be charged with the processing gas. When the processing gas is not being used in the processing apparatus, the gas supply pipe can be kept charged with the nonreactive gas all the time. Therefore, if the processing gas is not used in the processing apparatus, the processing gas does not contact with the metal in the pipe and thus a deposit generation inside the gas pipe can be prevented during that period. Accordingly, an entrance of deposits into the processing apparatus can be prevented when the use of the processing gas by the processing apparatus is resumed later.

Further, in the above apparatus or method, it is desirable that the gas supply pipe is branched into a primary pipe on the side of the processing gas supply source and a secondary pipe on the side of the processing apparatus; when charging the gas supply pipe with the processing gas, the control unit first exhausts the nonreactive gas from the primary pipe by evacuating the primary pipe to vacuum, then exhausts the nonreactive gas from the secondary pipe by evacuating the secondary pipe to vacuum, and then charges the primary and secondary pipes with the processing gas; and, when charging the gas supply pipe with the nonreactive gas, the control unit first exhausts the processing gas from the secondary pipe by evacuating the secondary pipe to vacuum, then exhausts the processing gas from the primary pipe by evacuating the primary pipe to vacuum, and then charges the primary and secondary pipes with the nonreactive gas.

As described above, when the nonreactive gas inside the gas supply pipe is exhausted to create a vacuum therein, the primary pipe on the side of the processing gas supply source is first evacuated to vacuum while the secondary pipe on the side of the processing apparatus is still charged with the nonreactive gas. Therefore, it is possible to evacuate the gas pipe to vacuum completely without affecting the gas pipe inside the processing apparatus. In addition, by performing the vacuum evacuation of the secondary pipe on the side of the processing apparatus first when the processing gas in the processing gas supply pipe is exhausted, the processing gas in the gas pipe closer to the processing apparatus side can be exhausted earlier.

Further, in the above apparatus or method, it is desirable that after the nonreactive gas is exhausted from the gas supply pipe to create the vacuum therein, the control unit performs a purge of the gas supply pipe by repeating an introduction of the nonreactive gas into the gas supply pipe and a vacuum evacuation thereof plural times in sequence before the gas supply pipe is charged with the processing gas; and, after the processing gas is exhausted from the gas supply pipe to create the vacuum therein, the control unit performs a purge or the gas supply pipe by repeating a vacuum evacuation or the gas supply pipe and an introduction of the nonreactive gas thereinto plural times in sequence before the gas supply pipe is charged with the nonreactive gas. Accordingly, residual gases or impurities inside the gas supply pipe can be removed completely.

In order to accomplish the object, in accordance with still another aspect of the present invention, there is provided a gas supplying system for supplying a processing gas (for example, a HF gas) to a plurality of processing apparatuses, respectively, including: a processing gas supply source for supplying the processing gas; a gas supply pipe connected to the processing gas supply source; a multiplicity of branch pipes for splitting the processing gas from the gas supply pipe to supply the processing gas into the plurality of processing apparatuses, respectively; a nonreactive gas supply source for supplying a nonreactive gas (for example, a $N_2$ gas) into the gas supply pipe and the multiplicity of branch pipes; a vacuum evacuation unit for exhausting the gas supply pipe and the multiplicity of branch pipes to vacuum; and a control unit for receiving a signal from the processing apparatus and controlling inner states of the gas supply pipe and the multiplicity of branch pipes in response to the received signal, wherein the control unit keeps the gas supply pipe and the multiplicity of branch pipes charged with the nonreactive gas to be in a standby state while the system is in operation; the control unit exhausts, if a processing gas use start signal is received from the processing apparatus, the nonreactive gas from the gas supply pipe and a part of the branch pipes currently being used to create a vacuum therein, then charges the gas supply pipe and the part of the branch pipes with the processing gas, and then starts a supply of the processing gas; and the control unit stops, if a processing gas use finish signal is received from the processing apparatus, the supply of the processing gas; then exhausts the processing gas from the gas supply pipe and a portion of the branch pipes not to be used to create a vacuum therein; and then charges the gas supply pipe and the portion of the branch pipes with the nonreactive gas.

In order to accomplish the object, in accordance with still another aspect of the present invention, there is provided a gas supplying method of a gas supplying system for supplying a processing gas (for example, a HF gas) to a plurality of processing apparatuses, respectively, the gas supplying system including a processing gas supply source for supplying the processing gas; a gas supply pipe connected to the processing gas supply source; a multiplicity of branch pipes for splitting the processing gas from the gas supply pipe to supply the processing gas into the plurality of processing apparatuses, respectively; a nonreactive gas supply source for supplying a nonreactive gas (for example, a $N_2$ gas) into the gas supply pipe and the multiplicity of branch pipes; a vacuum evacuation unit for exhausting the gas supply pipe and the multiplicity of branch pipes to vacuum; and a control unit for receiving a signal from the processing apparatus and controlling inner states of the gas supply pipe and the multiplicity of branch pipes in response to the received signal, the method including: keeping the gas supply pipe and the multiplicity of branch pipes charged with the nonreactive gas to be in a standby state while the system is in operation; exhausting, if the control unit receives a processing gas use start signal from the processing apparatus, the nonreactive gas from the gas supply pipe and a part of the branch pipes currently being used to create a vacuum therein, then charging the gas supply pipe and the part of the branch pipes with the processing gas, and then starting a supply of the processing gas; and stopping, if a processing gas use finish signal is received from the processing apparatus, the supply of the processing gas; exhausting the processing gas from the gas supply pipe and a portion of the branch pipes not to be used to create a vacuum therein; and then charging the gas supply pipe and the portion of the branch pipes with the nonreactive gas.

In accordance with the present invention described above, only when the processing gas is being used in the processing apparatus, the gas supply pipe and only a part of the branch pipes currently being used in the processing gas supply can be charged with the processing gas. When the processing gas is not being used in the processing apparatus the gas supply pipe and a portion of the branch pipes not to be used can be charged with the nonreactive gas. Therefore, if the processing gas is not used in the processing apparatus, the processing gas does not contact with the metal in the gas pipes and thus a deposit generation inside the gas pipe can be prevented during that period. Accordingly, entrance of deposits into the processing apparatus can be prevented when the use of the processing gas by the processing apparatus is resumed later.

Further, in the above apparatus or method, it is desirable that when the processing gas use start signal is received from the processing apparatus, the control unit determines whether other processing apparatus(es) than the processing apparatus that has transmitted the signal is using the processing gas, and if it is determined that the other processing apparatus(es) is using the processing gas, only the branch pipe connected to the processing apparatus serving as the signal transmitting source is evacuated to vacuum by exhausting the nonreactive gas therein and is charged with the processing gas, and a supply of the processing gas from the gas supply pipe is started, whereas if it is determined that the other processing apparatus(es) is not using the processing gas, the gas supply pipe and the branch pipe connected to the processing apparatus serving as the signal transmitting source is evacuated to vacuum by exhausting the nonreactive gas therein and is charged with the processing gas, and a supply of the processing gas from the processing gas supply source is started. Accordingly, when the processing gas use start signal is received from the processing apparatus, only the gas pipe being used in the processing gas supply can be evacuated to vacuum and charged with a processing gas.

Further, in the above apparatus or method, it is desirable that when charging both of the gas supply pipe and the branch pipe with the processing gas, the control unit evacuates the gas supply pipe and the branch pipe to vacuum in sequence, and charges both of the gas supply pipe and the branch pipe with the processing gas. As above described, when the nonreactive gas in both of the gas supply pipe and the branch pipes is exhausted to create a vacuum therein, the gas supply pipe on the side of the processing gas supply source is first evacuated to vacuum while the branch pipe on the side of the processing apparatus is still charged with the nonreactive gas. Therefore, it is possible to evacuate the gas pipe to vacuum completely without affecting the gas pipe of the processing apparatus side.

Furthermore, in the above apparatus or method, it is desirable that when the processing gas use finish signal is received from the processing apparatus, the control unit determines whether other processing apparatus(es) than the processing apparatus that has transmitted the signal is using the processing gas and if it is determined that the other processing apparatus(es) is using the processing gas, the supply of the processing gas from the gas supply pipe is stopped, and only the branch pipe connected to the processing apparatus serving as the signal transmitting source is evacuated to vacuum by exhausting the processing gas therein and is charged with the nonreactive gas, whereas if it is determined that the other processing apparatus(es) is not using the processing gas, the supply of the processing gas from the processing gas supply source is stopped, and the gas supply pipe and the branch pipe connected to the processing apparatus serving as the signal transmitting source are evacuated by exhausting the processing gas therein and are charged with the nonreactive gas. Accordingly, when the processing gas use finish signal is received, only the gas pipe not being used in the processing gas supply can be evacuated to vacuum and charged with a nonreactive gas.

Moreover, in the above apparatus or method, it is desirable that when charging both of the gas supply pipe and the branch pipe with the nonreactive gas, the control unit evacuates the branch pipe and the gas supply pipe to vacuum in sequence, and charges both of the gas supply pipe and the branch pipe with the nonreactive gas. Accordingly, by performing the vacuum evacuation of the branch pipe on the side of the processing gas supply source first when the processing gas in both of the gas supply pipe and the branch pipe is exhausted, the processing gas in the gas pipe closer to the processing apparatus side can be exhausted earlier.

Further, in the above apparatus or method, it is desirable that after the nonreactive gas in the part of the pipes being used is exhausted to create a vacuum therein, the control unit performs a purge of the part of the pipes by repeating an introduction of the nonreactive gas into the part of the pipes and a vacuum evacuation thereof plural times in sequence before the part of the pipes are charged with the processing gas; and after the processing gas in the portion of the gas pipes not to be used is exhausted to create a vacuum therein, the control unit performs a purge of the portion of the gas pipes by repeating a vacuum evacuation of the portion of the gas pipes and an introduction of the nonreactive gas thereinto plural times in sequence before the portion of the gas pipes are charged with the nonreactive gas. Accordingly, residual gases or impurities inside the gas supply pipe can be removed completely.

Effect of the Invention

In accordance with the present invention described above, by controlling the inner state of the gas pipe from the processing gas supply source to the processing apparatus depending on whether the processing gas is being used in the processing apparatus or not, the gas pipe can be kept charged with the nonreactive gas when the processing gas is not used in the processing apparatus. Therefore, a deposit generation inside the gas pipe can be prevented during that period. Accordingly, entrance of deposits into the processing apparatus can be prevented when the use of the processing gas by the processing apparatus is resumed later.

BRIEF DESCRIPTION OF THE DRAWINGS

FIG. 13 depicts a flowchart to describe an example of the processing gas supply finishing process shown in FIG. 12 when the processing gas is not used by other processing apparatus(es) (M/C)

EXPLANATION OF REFERENCE NUMERALS

Figure 1:
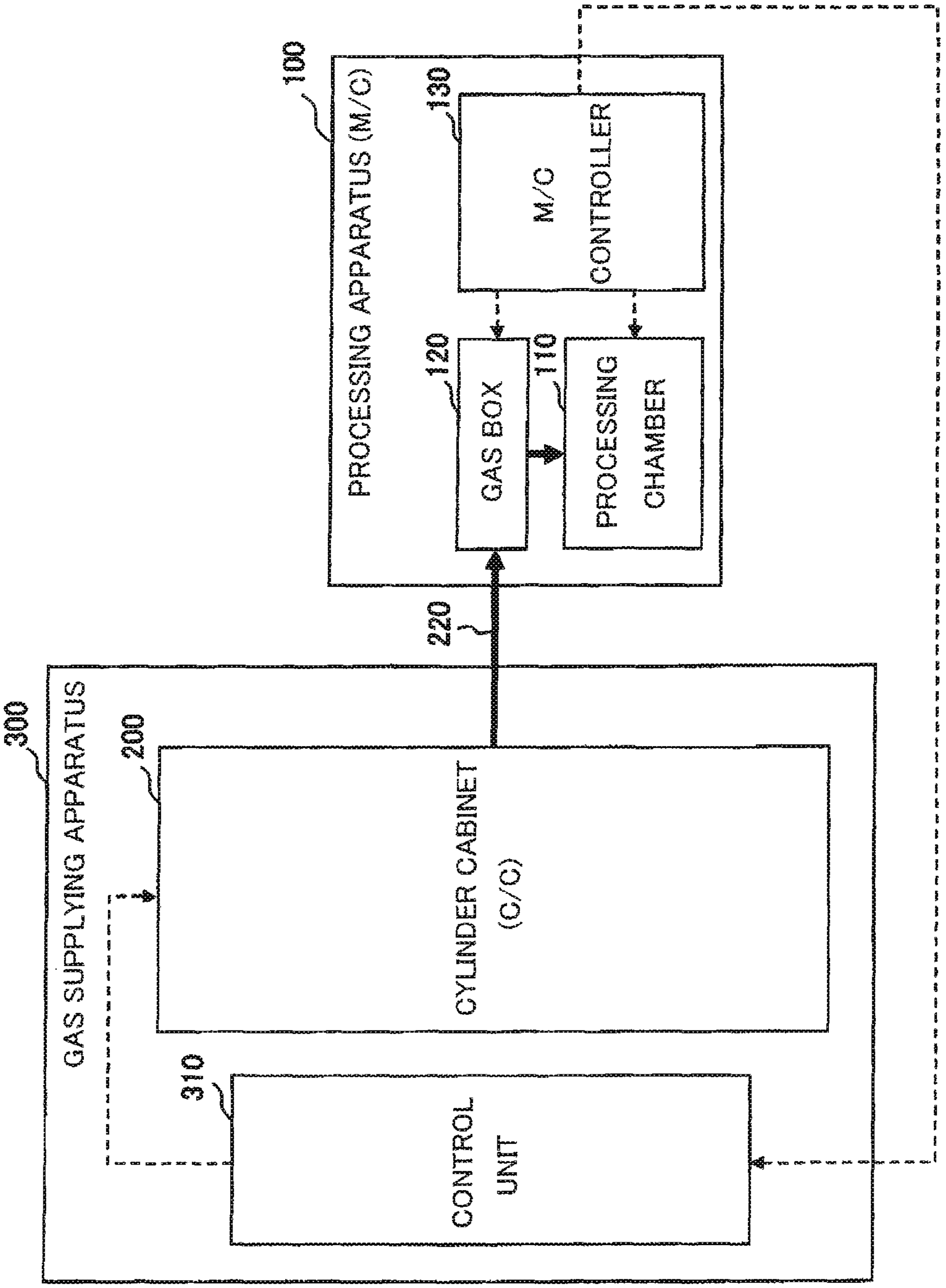
FIG. 1 is a block diagram showing a schematic configuration of a gas supplying system in accordance with a first embodiment of the present invention.

100 Processing apparatus (M/C)
100A to 100D Processing apparatuses (M/C)
110 Processing chamber
120 Gas box
122 Gas introduction pipe
200 Cylinder cabinet (C/C)
210 Gas cylinder
220 Gas supply pipe
220 Processing gas supply pipe
230 Nonreactive gas supply source
231 Nonreactive gas supply pipe
240 Vacuum generator
246 Gas exhaust pipe
247 Pipe
250 Vacuum pump
300 Gas supplying apparatus
310 Control unit
400 Branching box (B/B)
410A~410D Branch pipes
420 Nonreactive gas supply pipe
440 Vacuum exhaust pipe
S($S_A$, $S_B$, $S_C$, $S_D$) Processing gas supply starting signal
F($F_A$, $F_B$, $F_C$, $F_D$) Processing gas supply finishing signal

BEST MODE FOR CARRYING OUT THE INVENTION

Hereinafter, embodiments of the present invention will be described in detail with reference to the accompanying drawings. In the following description and various drawings, parts having the substantially same functions and arrangements will be assigned like reference numerals, while omitting redundant description thereof.

(Gas Supplying System of First Embodiment)

First, a gas supplying system in accordance with a first embodiment of the present invention will be explained. FIG. 1 provides a block diagram showing a schematic configuration of the gas supplying system in accordance with the first embodiment, and FIG. 2 sets forth a diagram showing an example of a pipe arrangement of the gas supplying system of FIG. 1. The gas supplying system in accordance with the first embodiment includes a gas supplying apparatus 300 for supplying a processing gas into a processing apparatus 100, as shown in FIG. 1.

The gas supplying apparatus 300 includes a cylinder cabinet (C/C) 200 for supplying a processing gas from a processing gas supply source into the processing apparatus 100 via a processing gas supply pipe (gas supply pipe) 220; and a control unit 310 for controlling each constituent component (for example, a valve or the like) of the cylinder cabinet (C/C) 200. Meanwhile, the processing apparatus (M/C) 100 includes a processing chamber 110 for performing therein an etching process, a film forming process, or the like on a target substrate such as a semiconductor wafer, a FPD (Flat Panel Display) substrate, or the like by using the processing gas; a gas box 120 for introducing the processing gas from the processing gas supply pipe 220 by opening a gas inlet valve and supplying the processing gas into the processing chamber 110 while controlling a flow rate of the processing gas; and an M/C controller 130 for controlling each, constituent component (a valve of the gas box 120, a supply of a high frequency power to the processing chamber 110, and so forth) of the processing apparatus 100.

Figure 2:
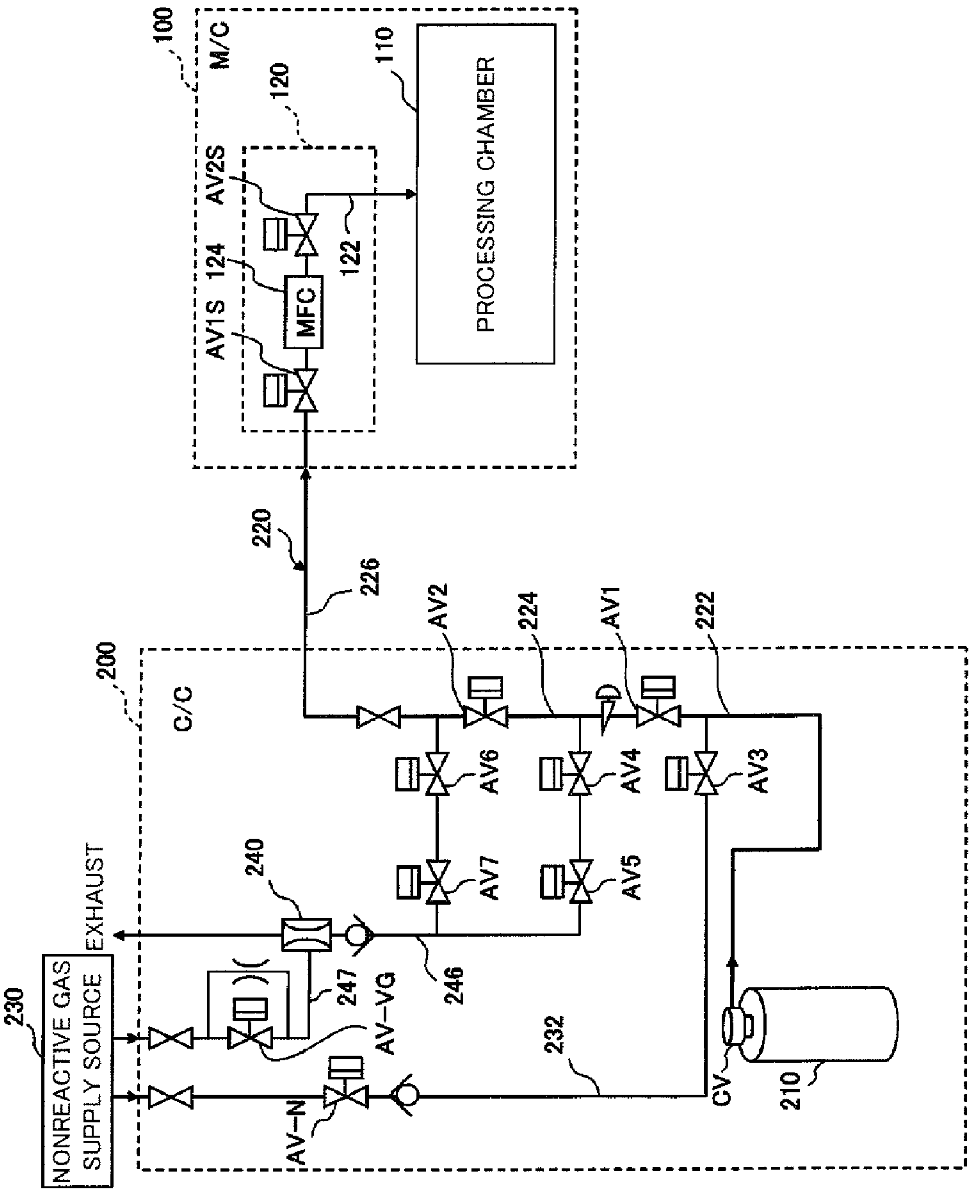
FIG. 2 illustrates an example of a gas pipe arrangement of the gas supplying system of FIG. 1.

Now, exemplary arrangements of gas pipes of the cylinder cabinet (C/C) 200 and the processing apparatus 100 will be explained with reference to FIG. 2. The cylinder cabinet (C/C) 200 includes a gas cylinder 210 as a processing gas supply source charged with a processing gas (for example, a HF gas), as shown in FIG. 2. The processing gas supply pipe 220 is connected to the gas cylinder 210.

Air valves AV1 and AV2 are installed on the processing gas supply pipe 220 in sequence from the side of the gas cylinder 210. By the presence of the air valves AV1 and AV2, the processing gas supply pipe 220 is split into a first pipe 222, a second pipe 224 and a third pipe 226 in sequence from the side of the gas cylinder 210. Further, in the first embodiment, the first and second pipes 222 and 224 constitute a primary pipe on the side of the gas cylinder 210 while the third pipe 226 constitutes a secondary pipe on the side of the processing apparatus 10.

Connected to the processing gas supply pipe 220 via a nonreactive gas supply pipe 232 is a nonreactive gas supply source 230 which supplies a nonreactive gas (for example, a $N_2$ gas) into the processing gas supply pipe 220 to a certain pressure degree. To elaborate, the nonreactive gas supply pipe 232 is connected to, for example, the first pipe 292 via an air valve AV3, as shown in FIG. 2. In addition, also installed on the nonreactive gas supply pipe 232 is an air valve AV-N which functions as a primary valve for opening or closing the nonreactive gas supply pipe 232. Accordingly, the supply of the nonreactive gas from the first pipe 222 into the processing gas supply pipe 220 can be carried out by controlling the air valves AV-N and AV3.

Further, connected to the processing gas supply pipe 220 via a gas exhaust pipe 246 is a vacuum generator 240 for evacuating the inside of the processing gas supply pipe 220 to vacuum. To be specific, as shown in FIG. 2, the gas exhaust pipe 246 is split in two: one is connected to the second pipe 224 via air valves AV5 and AV4 and the other is connected to the third pipe 224, 226 via air valves AV7 and AV6. Moreover, the vacuum generator 240 is coupled to, for example, a gas exhausting equipment within a factory in which the gas supplying system is installed. A gas from the gas exhaust pipe 246 is exhausted to, for example, the gas exhausting equipment via the vacuum generator 240.

The vacuum generator 240 is coupled to the nonreactive gas supply source 230 via a pipe 247. Further, an air valve AV-VG is installed on the pipe 247. When the air valve AV-VG is opened, the nonreactive gas from the nonreactive gas supply source 230 is flown into the vacuum generator 240 through the pipe 247 and exhausted out. As described, by flowing the nonreactive gas into the vacuum generator 240 through the pipe 247, the second and third gas pipes 224 and 226 can be evacuated to vacuum via the gas exhaust pipe 246.

Further, each of the air valves A1 to A7, AV-N and AV-VG, and a valve CV of the gas cylinder 210 are controlled by the control unit 310 shown in FIG. 1, respectively. The control unit 310 includes, for example, a CPU (Central Processing Unit); a ROM (Read Only Memory) to be used for the CPU to execute a process; a RAM (Random Access Memory); and a storage unit such as a hard disk, a memory, or the like for storing therein various programs to be executed by the CPU.

The gas box 120 of the processing apparatus (M/C) 100 has a gas introduction pipe 122 through which the processing gas is introduced from the cylinder cabinet (C/C) 200 and supplied into the processing chamber 110. Installed on the gas introduction pipe 122 are air valves AV1S and AV2S serving as gas inlet valves, and a flow rate controller such as a mass flow controller (MFC) 124 for controlling a flow rate of the processing gas flowing through the gas introduction pipe 122 is provided between the air valves AVIS and AV2S.

Moreover, each of the air valves AVIS and AV2S and the MFC 124 are controlled by the M/C controller 130 shown in FIG. 1. The M/C controller 130 includes, for example, a CPU (Central Processing Unit); a ROM (Read Only Memory) to be used for the CPU to execute a process; a RAM (Random Access Memory); and a storage unit such as a hard disk, a memory, or the like for storing therein various programs to be executed by the CPU.

The M/C controller 130 in accordance with the present embodiment sends a processing gas use start signal (S) to the control unit 310 when a certain process using the processing gas is performed in the processing chamber 110, and sends a processing gas use finish signal (F) to the control unit 310 when the process using the processing gas is ended in the processing chamber 110. The control unit 310 performs evacuation of the inside of the gas pipes based on the signals from the M/C controller 130 and performs a gas supplying process for introducing the processing gas or the nonreactive gas.

(Detailed Example of Gas Supplying Process in Accordance with First Embodiment)

Figure 3:
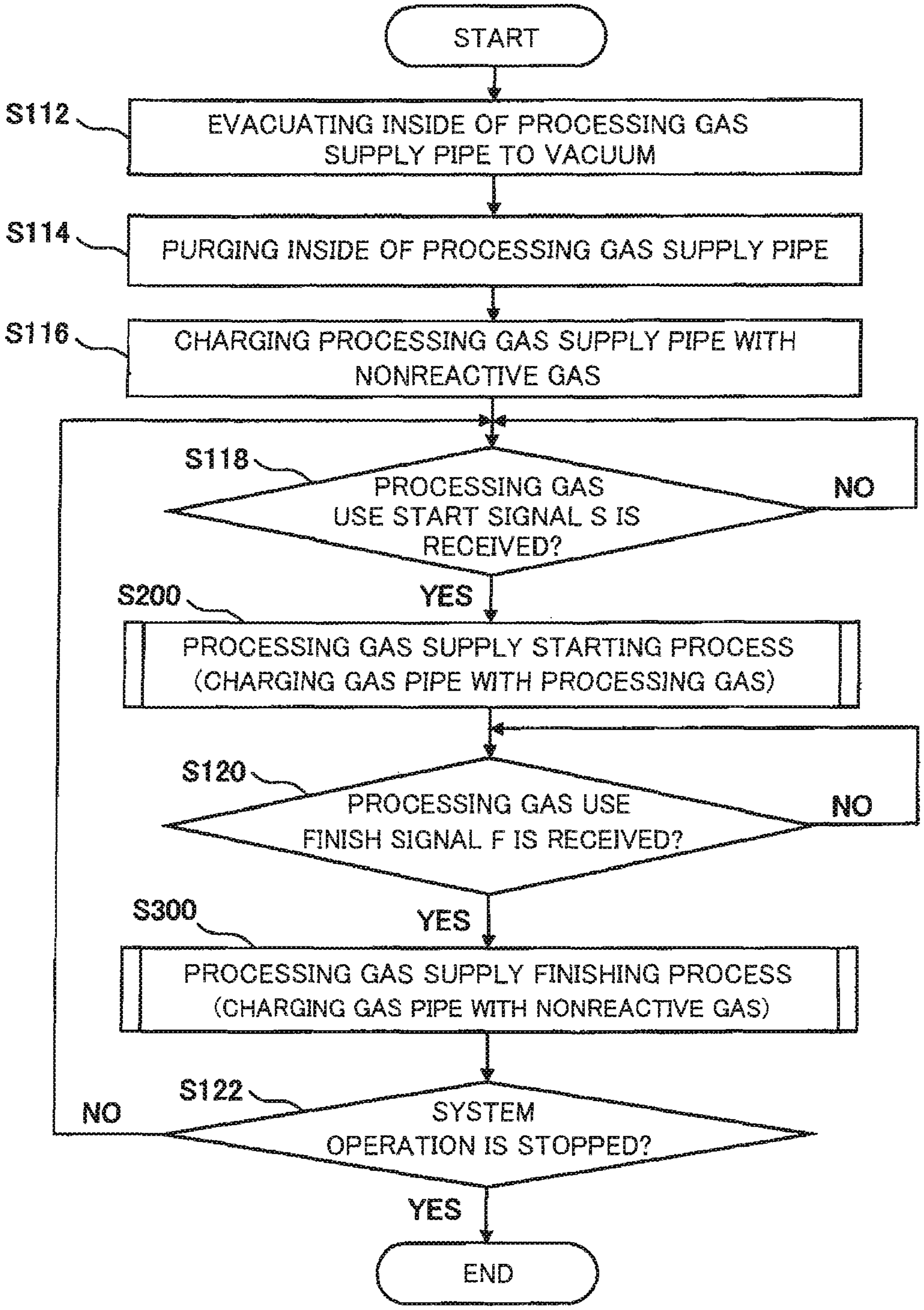
FIG. 3 presents a flowchart to describe an example of a gas supplying process in accordance with the first embodiment of the present invention.

Now, an example of gas supplying process performed by the processing gas supplying system in accordance with the first embodiment will be described with reference to the accompanying drawing. FIG. 3 presents a flowchart to describe the exemplary gas supplying process in accordance with the first embodiment. If the processing gas supplying system is operated, the control unit 310 controls individual constituent components of the cylinder cabinet 200 based on, for example, a program stored in the storage unit, thereby carrying out the gas supplying process.

In a step S112, the inside of the processing gas supply pipe 220 is evacuated to vacuum by the vacuum generator 24Q, and in a step S114, the inside of the processing gas supply pipe 220 is purged by a nonreactive gas (for example, a $N_2$ gas) from the nonreactive gas supply source 230. Here, by repeating the vacuum evacuation by, for example, the vacuum generator 240 and the supply of the nonreactive gas multiple times, the inside of the processing gas supply pipe 220 is purged. Upon the completion of the purge of the inside of the processing gas supply pipe 220, the processing gas supply pipe 220 is charged with the nonreactive gas to a certain pressure degree in a step S116.

In this state, a step S118 is performed wherein a reception of a processing gas use start signal S is awaited. When the use of the processing gas is started in the processing apparatus 100, the M/C controller 130 transmits the processing gas use start signal S to the control unit 310. For example, it may be desirable to transmit the processing gas use start signal S at the moment the semiconductor wafer is loaded into the processing chamber 110 after the condition of the processing chamber 110 is adjusted.

Then, if the control unit 310 receives the processing gas use start signal S from the M/C controller 130 in the step S118, a processing gas supply starting process is performed in a step S200. For example, in the processing gas supply starting process, the inside of the processing gas supply pipe 220 is evacuated to vacuum, and a necessary valve such as the valve CV of the gas cylinder 210 and the like is opened, so that the processing gas supply pipe 220 is charged with the processing gas to a certain pressure degree. Thus, the processing gas can be ready to be used on the side of the processing apparatus 100.

Accordingly, in the processing apparatus 100, the processing gas can be introduced into the processing chamber 110 by opening the air valves AV1S and AV2S of the gas box 120 under the control of the M/C controller 130. Then, the processing apparatus 100 performs a desired process (for example, an etching process of the semiconductor wafer) by the processing gas. Further, a control of inner states of the gas pipes by the processing gas supply starting process will described later in detail.

Subsequently, a step S120 is performed wherein a reception of a processing gas use finish signal is awaited. At this time, when the use of the processing gas in the processing apparatus 100 is completed, the M/C controller 130 sends the processing gas use finish signal to the control unit 310. For example, if the process by the processing gas in the processing chamber 11 is completed in the processing apparatus 100, the air valves AV1S and AV2S of the gas box 120 are closed so that the introduction of the processing gas into the processing chamber 110 is stopped. Thus, it may be desirable to transmit the processing gas use finish signal at this moment.

If the control unit 310 receives the processing gas use finish signal F from the M/C controller 130 in the step S120, a processing gas supply finishing process is performed in a step S300. For example, a necessary valve Suds as the valve CV of the gas cylinder or the like is closed to stop the supply of the processing gas, and the processing gas supply pipe 220 is evacuated to vacuum and then charged with the nonreactive gas.

Accordingly, when the processing gas is not used by the processing apparatus 100, the inside of the processing gas supply pipe 220 (that is, the inside of all the gas pipes from the gas cylinder 210 to the processing apparatus 100) is filled with the nonreactive gas. Therefore, a deposit generation hardly takes place inside the processing gas supply pipe 220 during that period. As a result, when the processing gas is used again later, an entrance of a deposit into the processing chamber 110 can be prevented. Further, a control of inner state of the gas pipes by the processing gas supply finishing process will be described later in detail.

Subsequently, it is determined in a step S122 whether the operation of the processing gas supplying system will be stopped. If it is determined in the step S122 that the operation of the gas supplying system would not be stopped, the process returns to the step S118, whereas if the operation is decided to be stopped, the operation is immediately finished. In the processing gas supply finishing process, since the inside of the processing gas supply pipe 220 is charged with the nonreactive gas, there arises no problem even if the operation is immediately stopped. Further, it is also possible to evacuate the inside of the processing gas supply pipe 220 to vacuum, to purge it with a nonreactive gas, and then to recharge it with the nonreactive gas again.

(Detailed Example of Processing Gas Supply Starting Process)

Figure 4:
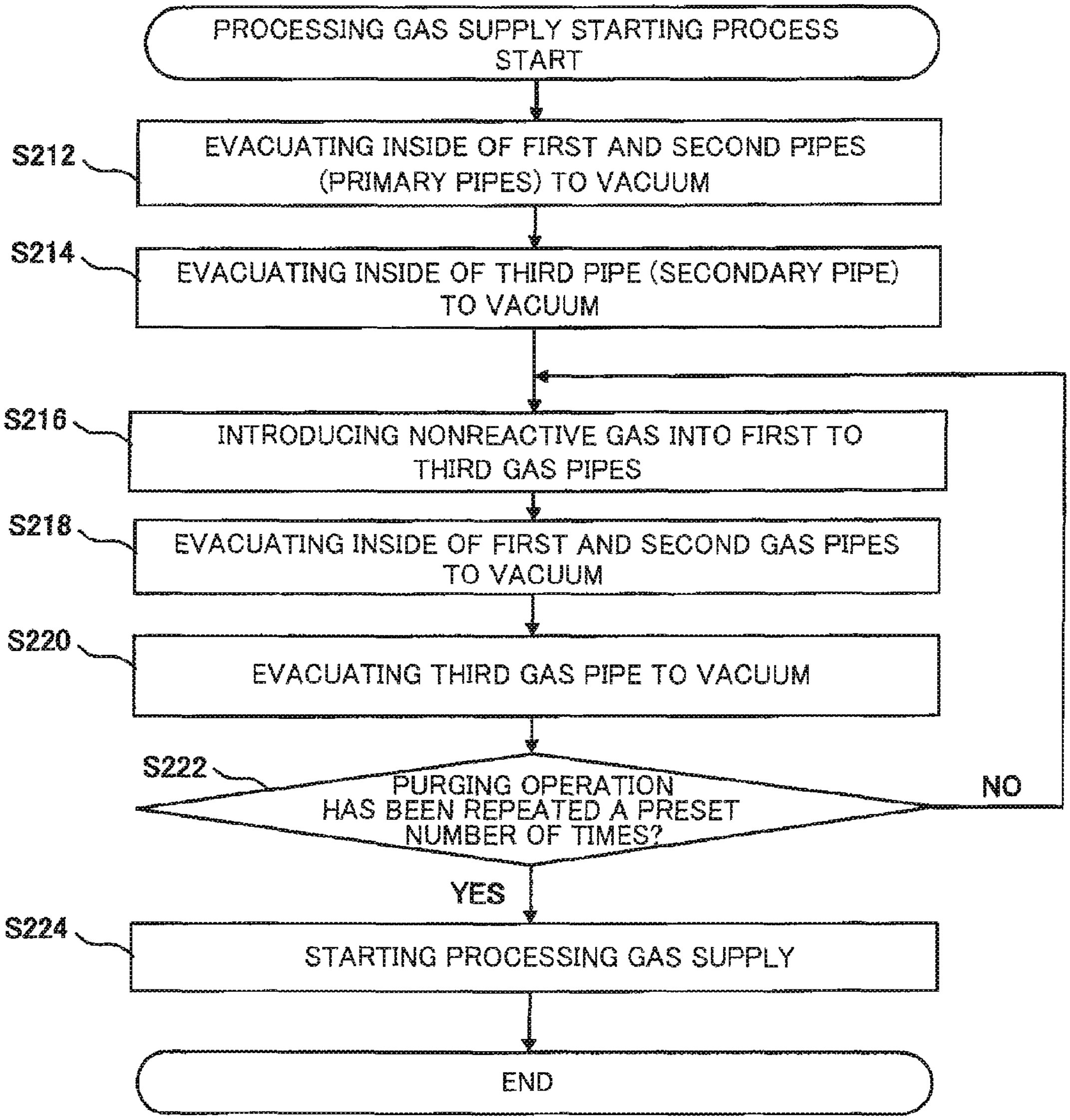
FIG. 4 depicts a flowchart to describe an example of a processing gas supply starting process shown in FIG. 3.

Here, an example of the processing gas supply starting process (step S200) in accordance with the first embodiment will be explained with the accompanying drawing. FIG. 4 provides a flowchart to describe the exemplary processing gas supply starting process in accordance with the first embodiment. First, in steps S212 to S214, vacuum evacuation of the inside of the processing gas supply pipe 220 is carried out. That is, the primary pipe of the processing gas supply pipe 220, i.e., the first and second pipes 222 and 224, are exhausted to vacuum in the step S212. To be specific, by opening the air valve AV-VG shown in FIG. 2 and then opening the air valves AV5, AV4 and AV1 in sequence, the first and second pipes 222 and 224 are allowed to communicate with the gas exhaust pipe 246, and the first and second pipes 222 and 224 are evacuated to vacuum by the vacuum generator 240. After a preset time period elapses in this state, the air valves AV1, AV4 and AV5 are closed while the air valve AV-VG is still opened. Accordingly, the vacuum evacuation of the first and second pipes 222 and 224 is completed, so that the nonreactive gas is exhausted therefrom.

Next, the secondary pipe of the processing gas supply pipe 220, i.e., the third gas pipe 226, is evacuated to vacuum in the step S214. To elaborate, by opening the air valves AV7 and AV6 shown in FIG. 2, the third gas pipe 226 is allowed to communicate with the gas exhaust pipe 246. At this time, since the air valve AV-VG is opened, the third gas pipe 226 is exhausted to vacuum by the vacuum generator 240. After a lapse of a predetermined time period in this state, the air valves AV6 and AV7 are closed, and then the air valve AV-VG is also closed. Thus, the vacuum evacuation of the third gas pipe 226 is completed, so that the nonreactive gas inside the third gas pipe 226 is exhausted.

Subsequently, the inside of the processing gas supply pipe 220 is purged in steps S216 to S222. First, in the step S216, a nonreactive gas (for example, a N) gas) is introduced into each gas pipe of the primary and secondary pipes of the processing gas supply pipe 220, that is, each of the first to the third pipes 222, 224 and 226. To be specific, by opening the air valve AVON shown in FIG. 2 and then opening the air valves AV3, AV1 and AV2 in sequence, the first to the third pipes 222, 224 and 226 are allowed to communicate with the nonreactive gas supply pipe 232, and the nonreactive gas is introduced from the nonreactive gas supply source 230 into each of the first to the third gas pipes 222, 224 and 226 via the nonreactive gas supply pipe 232. After a preset time period elapses in this state, the air valves AV1, AV2 and AV3 are closed, and the air valve AV-N is also closed. As a result, the nonreactive gas is introduced into the processing gas supply pipe 220.

Subsequently, in the step S218, the primary pipe (i.e., the first and second pipes 222 and 224) is evacuated to vacuum, and in the step S220, the secondary pipe (i.e., the third gas pipe 226) is evacuated to vacuum. Specific processes of the steps S218 and S220 are identical with those of the steps S212 and 214.

Then, it is determined in the step S222 whether the purging operation has been repeated a preset number of times. If the purging operation has not been performed the preset number of times yet, the purging operation is repeated through the steps S216 to S220. Meanwhile, if it is found that the purging operation has been already performed the preset number of times, a supply of the processing gas is begun in a step S224. That is, C/C supply system valves (the valve CV of the gas cylinder 210, the air valves AV1 and AV2) are opened, so that the processing gas is supplied into the processing gas supply pipe 220 to be ready to be used. Thus, the whole processing gas supply starting process is terminated.

As described above, through the processing gas supply starting process performed based on the processing gas use start signal S from the processing apparatus 100, the inside of the processing gas supply pipe 220 is replaced with the processing gas. Accordingly, by opening the gas inlet valves AV1S and AV2S of the gas box 120, the processing gas can be introduced into the processing chamber 110 of the processing apparatus 100.

Further, when the nonreactive gas inside the processing gas supply pipe 220 is exhausted to create a vacuum therein, the primary pipe on the side of the processing gas supply source is first evacuated to vacuum while the secondary pipe on the side of the processing apparatus 100 is still charged with the nonreactive gas. Therefore, it is possible to evacuate the gas supply pipe to vacuum completely without affecting gas pipes inside the processing apparatus 100. Furthermore, by performing the purging operation, in which the introduction of the nonreactive gas and the vacuum evacuation are repeated multiple times in sequence prior to charging the inside of the processing gas supply pipe 220 with the processing gas, residual gases or impurities inside the processing gas supply pipe 220 can be removed completely.

(Detailed Example of Processing Gas Supply Finishing Process)

Figure 5:
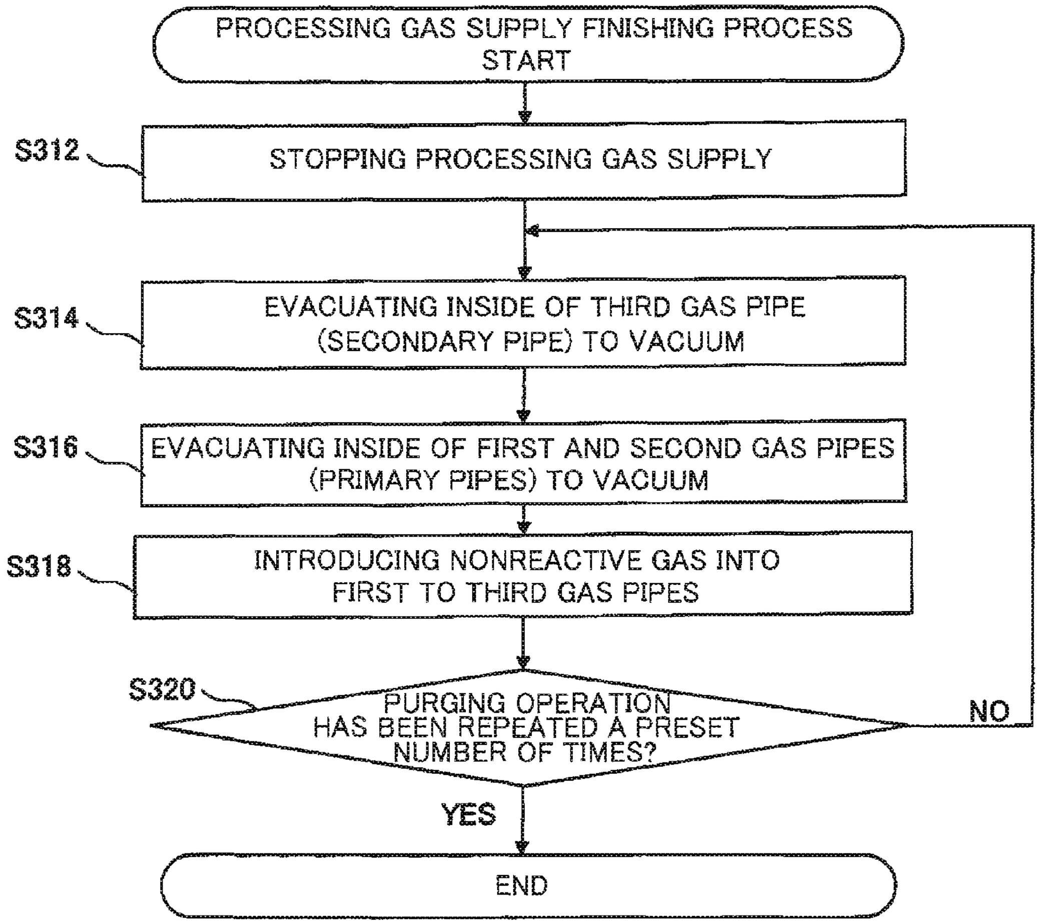
FIG. 5 offers a flowchart to describe an example of a processing gas supply finishing process shown in FIG. 3.

Now, an example of the processing gas supply finishing process (step S300) in accordance with the first embodiment will be explained with reference to the accompanying drawing. FIG. 5 sets Forth a flowchart to describe the exemplary processing gas supply finishing process in accordance with the first embodiment. First, in a step S312, the C/C supply system valves (the valve CV of the gas cylinder 210, the air valves AV1 and AV2) are closed, so that the supply of the processing gas from the gas cylinder 210 is stopped.

Subsequently, in steps S314 to S320, a purge of the inside of the processing gas supply pipe 220 is carried out. First, in the step S314, the gas pipe between the cylinder cabinet (C/C) 200 and the processing apparatus 100 (that is, the third pipe 226) is evacuated to vacuum. To be specific, by opening the air valve AV-VG shown in FIG. 2 and then opening the air valves AV7 and AV6 in sequence, the third pipe 226 is allowed to communicate with the gas exhaust pipe 246, and is exhausted to vacuum by the vacuum generator 240. After a preset time period elapses in this state, the air valves AV6 and AV7 are closed while the air valve AV-VG is still opened. Accordingly, the vacuum evacuation of the third gas pipe 226 is completed, so that the processing gas within the third pipe 226 is exhausted.

Next, in the step S316, the gas pipes of the cylinder cabinet (C/C) 200 (the first and second pipes 222 and 224) are evacuated to vacuum. To elaborate, by opening the air valves AV5, AV4 and AV1 shown in FIG. 2, the first and second pipes 222 and 224 are allowed to communicate with the gas exhaust pipe 246. At this time, since the air valve AV-VG is opened, the first and second pipes 222 and 224 are exhaust to vacuum by the vacuum generator 240. After a certain time period passes by in this state, the air valves AV1, AV4 and AV5 are closed, and the air valve AV-VG is also closed. Accordingly, the vacuum evacuation of the first and second pipes 222 and 224 is completed, so that the processing gas in the first and second pipes 222 and 224 is exhausted.

Thereafter, in the step s318, a nonreactive gas (for example, a $N_2$ gas) is introduced into the first to the third gas pipes 222, 224 and 226, i.e., into the entire processing gas supply pipe 220. A specific process of the step S318 is identical with that of the step S216 described in FIG. 4.

Then, it is determined in the step S320 whether the purging operation has been repeated a preset number of times. If it is found that the purging operation has not been performed the preset number of times, the purging opera-ion through the steps S314 to S318 is carried out again. Meanwhile, if it is found that the purging operation has already been performed the preset number of times, the whole processing gas supply finishing process is completed.

As described above, through the processing gas supply finishing process performed based on the processing gas use finish signal F sent from the processing apparatus 100, the inside of the processing gas supply pipe 220 is replaced with the nonreactive gas. Thus, since the inside of the processing gas supply pipe 220 is maintained charged with the nonreactive gas until a next processing gas use start signal S is received, a deposit generation due to a reaction with the processing gas and the metal forming the gas supply pipe can be prevented from occurring during that period.

Moreover, by performing the vacuum evacuation of the secondary pipe on the side of the processing apparatus first when the processing gas in the processing gas supply pipe 220 is exhausted, the processing gas in the gas pipe closer to the processing apparatus side can be exhausted earlier. Furthermore, by performing the purging operation, in which the vacuum evacuation and the introduction of the nonreactive gas are repeated multiple times in sequence, prior to charging the inside of the processing gas supply pipe 220 with the nonreactive gas, residual gases or impurities in the processing gas supply pipe 220 can be eliminated completely.

Figure 6:
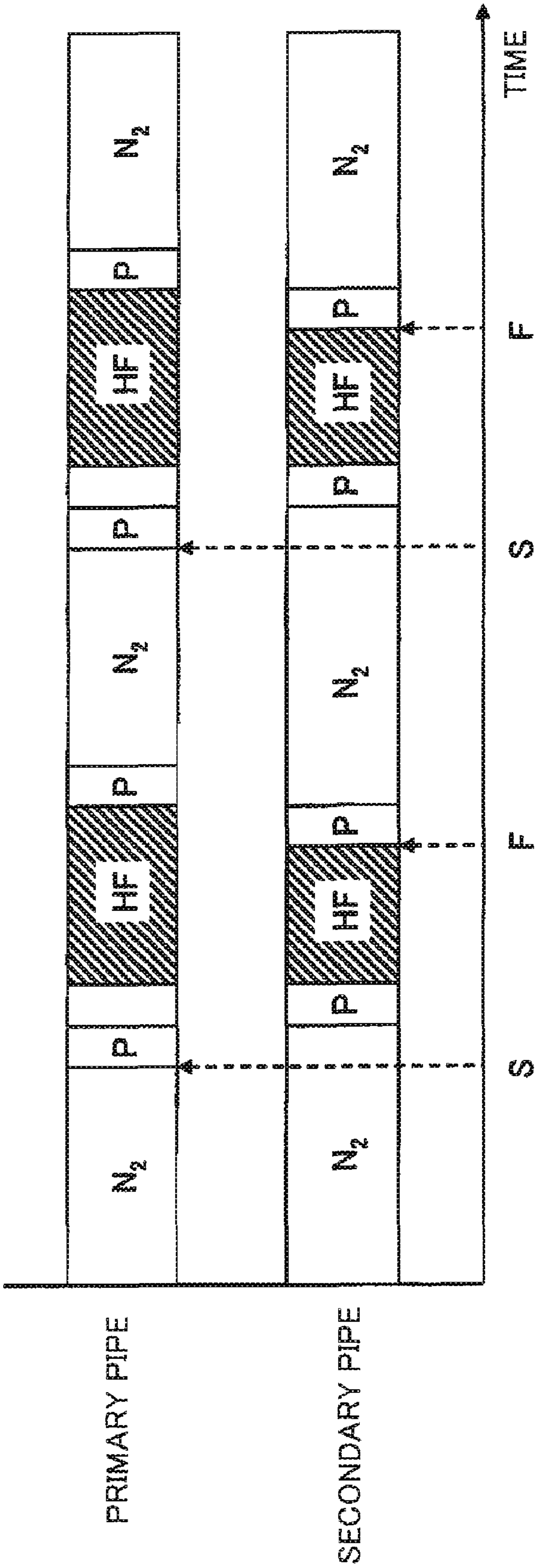
FIG. 6 sets forth a diagram to describe an inner state of each gas pipe in accordance with the first embodiment of the present invention.

In accordance with the gas supplying method of the above-described first embodiment, inner states of the gas pipes are as shown in FIG. 6, for example. That is, the processing gas supply pipe 220 is usually charged with the nonreactive gas (for example, the $N_2$ gas) in a standby state. Then, if the processing gas use start signal S is received from the processing apparatus 100, the vacuum evacuation and purge (P) of the inside of the primary pipe (first and second pipes 222 and 224) of the processing gas supply pipe 220 are first performed, and, then, the vacuum evacuation and purge (P) of the secondary pipe (third pipe 226) is carried out. Thereafter, the valve CV of the gas cylinder 210 is opened, and the primary and secondary pipes of the processing gas supply pipe 220 are charged with the processing gas (for example, the HF gas) to a certain pressure degree so that the processing gas is ready to be used.

Afterwards, if the processing gas use finish signal F is received from the processing apparatus 100, the valve CV of the gas cylinder 210 is closed, and the vacuum evacuation and purge (P) of the inside of the secondary pipe of the processing gas supply pipe 220 is performed. Then, the vacuum evacuation and purge (P) of the primary pipe is carried out. Thereafter, the primary and secondary pipes of the processing gas supply pipe 220 are charged with the nonreactive gas to a certain pressure degree.

By the aforementioned method, it is possible to charge the inside of the processing gas supply pipe 220 with the processing gas only while the processing gas is being used by the processing apparatus 100. Accordingly, since the inside of the processing gas supply pipe 220 is kept charged with the nonreactive gas when the processing gas is not used in the processing apparatus 100, a deposit generation inside the processing gas supply pipe 220 does not take place during that period. Thus, an entrance of deposits into the processing chamber 110 can be prevented when the use of the processing gas is resumed later.

Furthermore, in comparison with a case of charging the entire processing gas supply pipe 220 with the processing gas all the time, a time period during which the metal of the processing gas supply pipe contacts the processing gas can be greatly reduced. Therefore, a reaction between the metal of the processing gas supply pipe and the processing gas can be remarkably suppressed in comparison with conventional cases.

(Gas Supplying System in Accordance with Second Embodiment)

Figure 7:
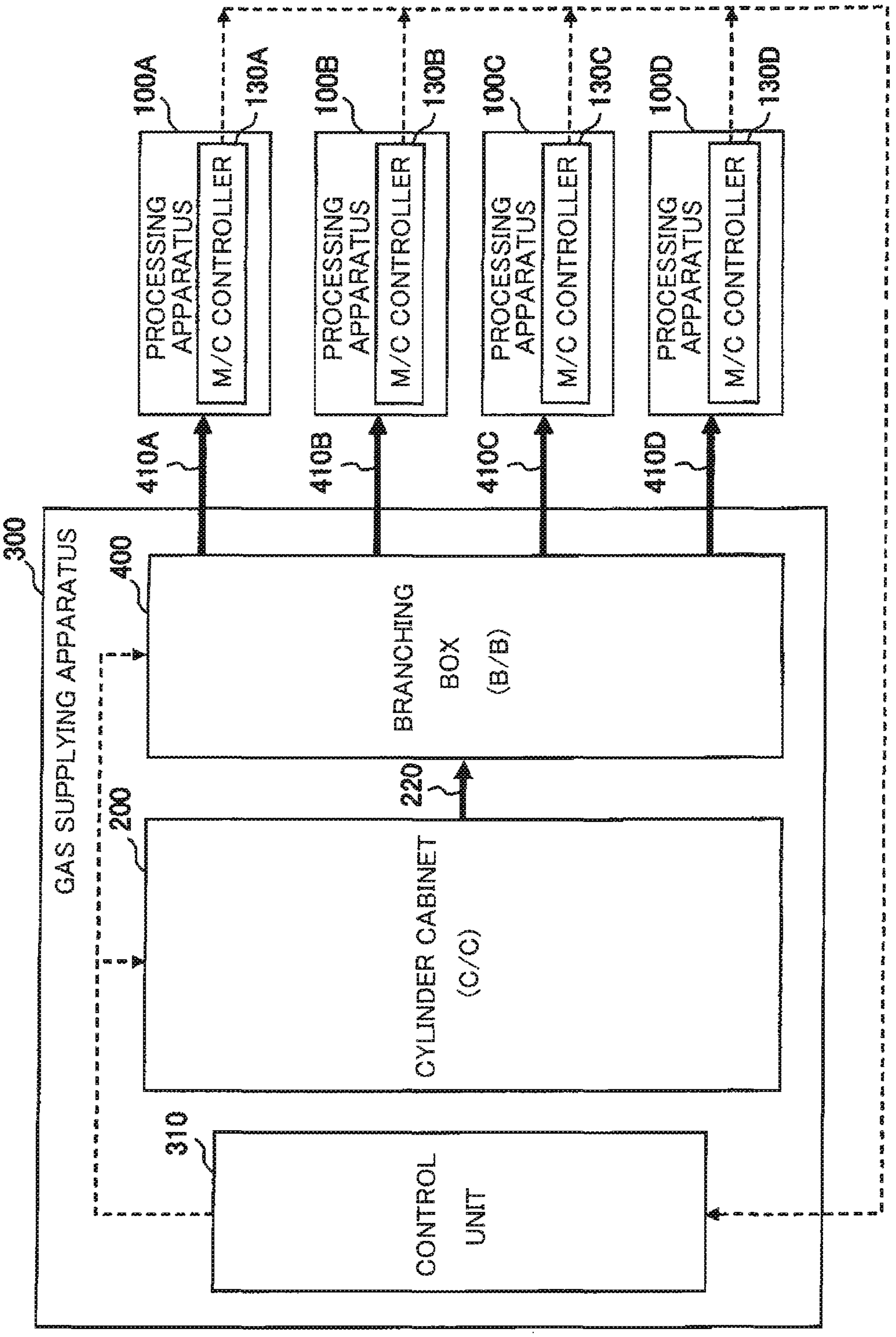
FIG. 7 is a block diagram showing a schematic configuration of a gas supplying system in accordance with a second embodiment of the present invention.
Figure 8:
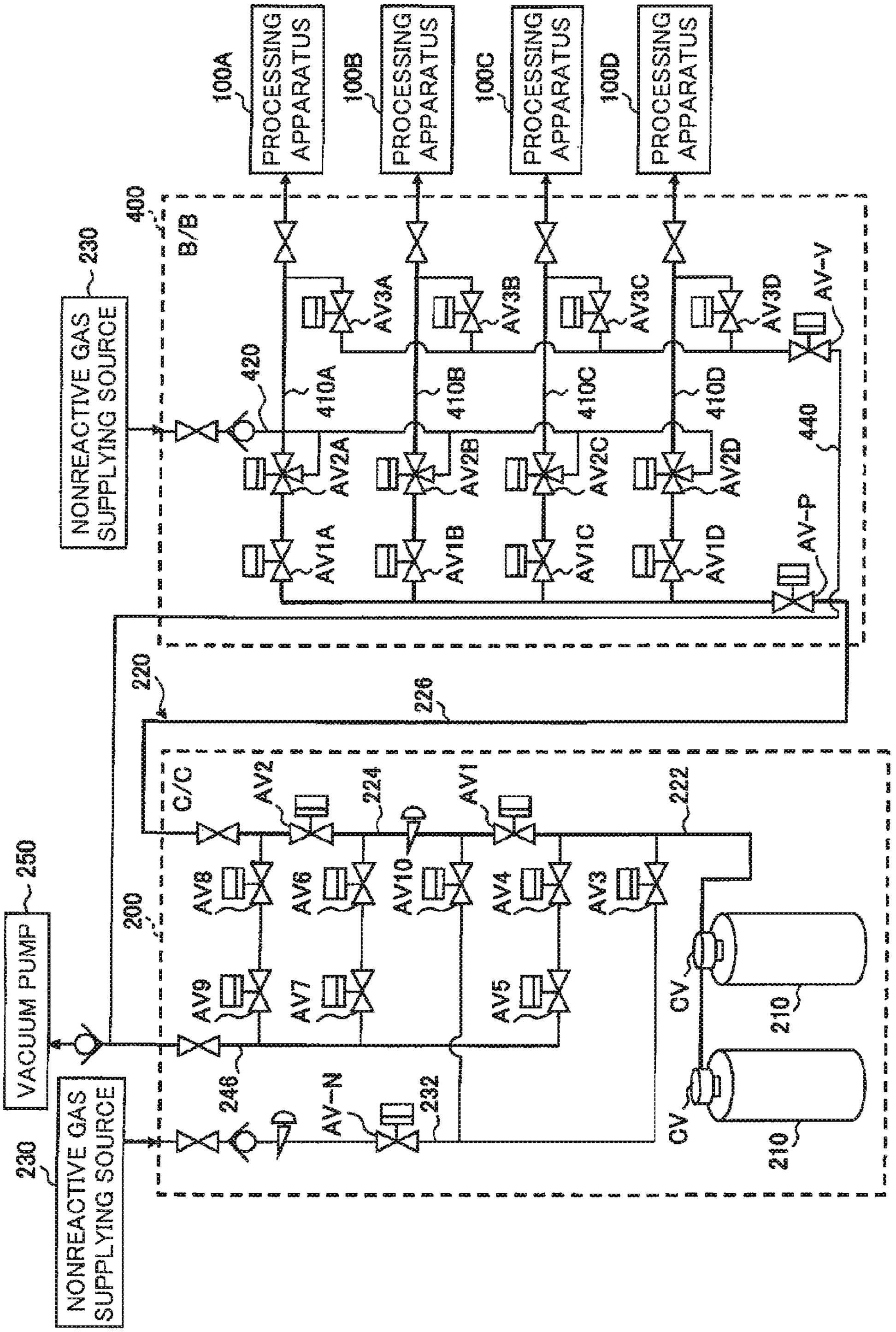
FIG. 8 sets forth an example of a gas pipe arrangement of the gas supplying system of FIG. 7.

Now, a gas supplying system in accordance with a second embodiment of the present invention will be described. FIG. 7 is a block diagram showing a schematic configuration of the gas supplying system in accordance with the second embodiment, and FIG. 8 illustrates an example of an arrangement of gas pipes of the gas supplying system of FIG. 7. Though the above first embodiment has been described for the case of supplying a processing gas into a single processing apparatus, the gas supplying system in accordance with the second embodiment supplies a processing gas into a plurality of (For example, four) processing apparatuses. Further, since an exemplary arrangement of gas pipes of each of the first to the fourth processing apparatuses 100A to 100 is identical with that of the processing apparatus 100 shown in FIG. 2, a detailed description thereof will be omitted.

In the gas supplying system in accordance with the second embodiment, a processing gas from a cylinder cabinet (C/C) 200 is split by a branching box (B/B) 400 to be supplied into the plural processing apparatuses 100A to 100D as shown in FIG. 7. For example, as illustrated in FIG. 8, a processing gas supply pipe 220 from, the cylinder cabinet (C/C) 200 is divided into four branch pipes (first to fourth branch pipes) 410A to 410D within the branching box (B/B) 400. The branch pipes 410A to 410D are connected to individual gas boxes (not shown) of the processing apparatuses 100A to 100D, respectively.

Air valves AV1A to AV1D constituting gas inlet valves are installed on the branch pipes 410A to 410D, respectively. By controlling opening closing of the air valves AV1A to AV1D selectively, it is possible to supply the processing gas from the processing gas supply pipe 220 into a desired branch pipe and stop the supply.

Moreover, on the respective branch pipes 413A to 410D, air valves AV2A to AV2D are also installed at the downstream side of the air valves AV1A to AV1D, respectively. Each of the air valves AV2A to AV2D is connected to a nonreactive gas supply pipe 420, which is coupled to a nonreactive gas supply source 230. By controlling opening/closing of the air valves AV2A to AV2D selectively, it is possible to supply a nonreactive gas (for example, a $N_2$ gas) from the nonreactive gas supply source 230 into a desired branch pipe and stop the supply.

Moreover, connected to each of the branch pipes 410A to 410D via a vacuum exhaust pipe 440 is a vacuum pump 250 for performing vacuum evacuation or purge of the inside of each pipe. The vacuum exhaust pipe 440 is connected to the branch pipes 410A to 410D via air valves AV3A to AV3D, respectively. Further, also installed on the vacuum exhaust pipe 440 is an air valve AV-V serving as a primary valve for opening or closing the vacuum exhaust pipe 440. By controlling opening/closing of the air valve AV-V and also controlling opening/closing of the air valves AV3A to AV3D selectively, vacuum evacuation of a desired branch pipe can be carried out.

Within the branching box (B/B) 400, there is provided an air valve AV-P installed on a third pipe 226 of the processing gas supply pipe 220. The air valve AV-P is usually opened but is closed when the branching box B/B 400 is separated from the cylinder cabinet (C/C) 200 to carry out, for example, a maintenance work.

Now, an example of a configuration of the cylinder cabinet (C/C) 200 in accordance with the second embodiment will be explained with reference to FIG. 8. Though the first embodiment has been described for the case of performing vacuum evacuation of gas pipes by means of the vacuum generator 240 shown in FIG. 2, vacuum evacuation of the gas pipes in the second embodiment is carried out by a vacuum pump 250, instead of the vacuum generator 240.

For example, as shown in FIG. 8, the vacuum pump 250 is connected to the processing gas supply pipe the first to the third pipes) 220 via a gas exhaust pipe 246. Here, the gas exhaust pipe 246 is branched to be connected to the first pipe 222 via air valves AV5 and AV4, to the second pipe 224 via air valves AV7 and AV6, and to the third gas pipe 226 via air valves AV9 and AV8. By controlling opening/closing of the air valves AV5 and AV4, the air valves AV7 and AV6, and the air valves AV9 and AV8 selectively, it is possible to carry out vacuum evacuation of the first to the third gas pipes 222, 224 and 226 selectively.

The nonreactive gas supply source 230 for supplying the nonreactive gas (for example, the $N_2$ gas) into the processing gas supply pipe 220 is connected to the processing gas supply pipe 220 via the nonreactive gas supply pipe 232. To elaborate, as shown in FIG. 8, the nonreactive gas supply pipe 232 is split to be connected to the first and second pipes 222 and 224 via air valves AV3 and AV10, respectively. Further, also installed on the nonreactive gas supply pipe 232 is an air valve AV-N serving as a primary valve for opening or closing the nonreactive gas supply pipe 232. By controlling opening/closing of the air valve AV-N and also controlling opening/closing of the air valves AV3 and AV10 selectively, it is possible to supply the nonreactive gas into the processing gas supply pipe 220 selectively from either one of the first and second pipes 222 and 224.

A control unit 310 in the second embodiment controls individual constituent components of the cylinder cabinet (C/C) 200 and the branching box (B/B) 400, as shown in FIG. 7. For example, the air valves AV1A to AV3A, AV1B to AV3B, AV1C to AV3C, AV1D to AV3D, AV-P, AV-V of the branching box (B/B) 400 as well as the air valves AV1 to AV10 and AV-N of the cylinder cabinet (C/C) 200 and the valve CV of the gas cylinder 210 are controlled by the control unit 310*n*, respectively.

Furthermore, the processing apparatuses (M/C) 100A to 100D include their own M/C controllers 130A to 130D, respectively, as illustrated in FIG. 7. Each of the M/C controllers 130A to 130D transmits a processing gas supply start signal S to the control unit 310 when the processing gas is being used, while sending a processing gas supply finish signal F to the control unit 310 when a process by the processing gas is completed. Based on the signals from the M/C controllers 130A to 130D, the control unit 310 carries out a gas supplying process by evacuating the inside of the gas pipes to vacuum and then introducing the processing gas or the nonreactive gas thereinto.

Further, in the second embodiment, since the processing gas supply start signal S and the processing gas supply finish signal F are received from each of the M/C controllers 130A to 130D, subscripts A to D are added to each of the notations S and F to distinguish them. Accordingly, notations $S_A$, $S_B$, $S_C$ and $S_D$ represent processing gas supply start signals received from the M/C controllers 130A to 130D, respectively, and notations $F_A$, $F_B$, $F_C$ and $F_D$ denote processing gas supply finish signals received from the M/C controllers 130A to 130D, respectively. In addition, in the second embodiment, a notation <S> without having a subscript indicates one of the processing gas supply start signals $S_A$ to $S_D$, while a notation <F> without having a subscript refers to one of the processing gas supply finish signals $F_A$ to $F_D$.

(Detailed Example of Gas Supplying Process in Accordance with Second Embodiment)

Figure 9:
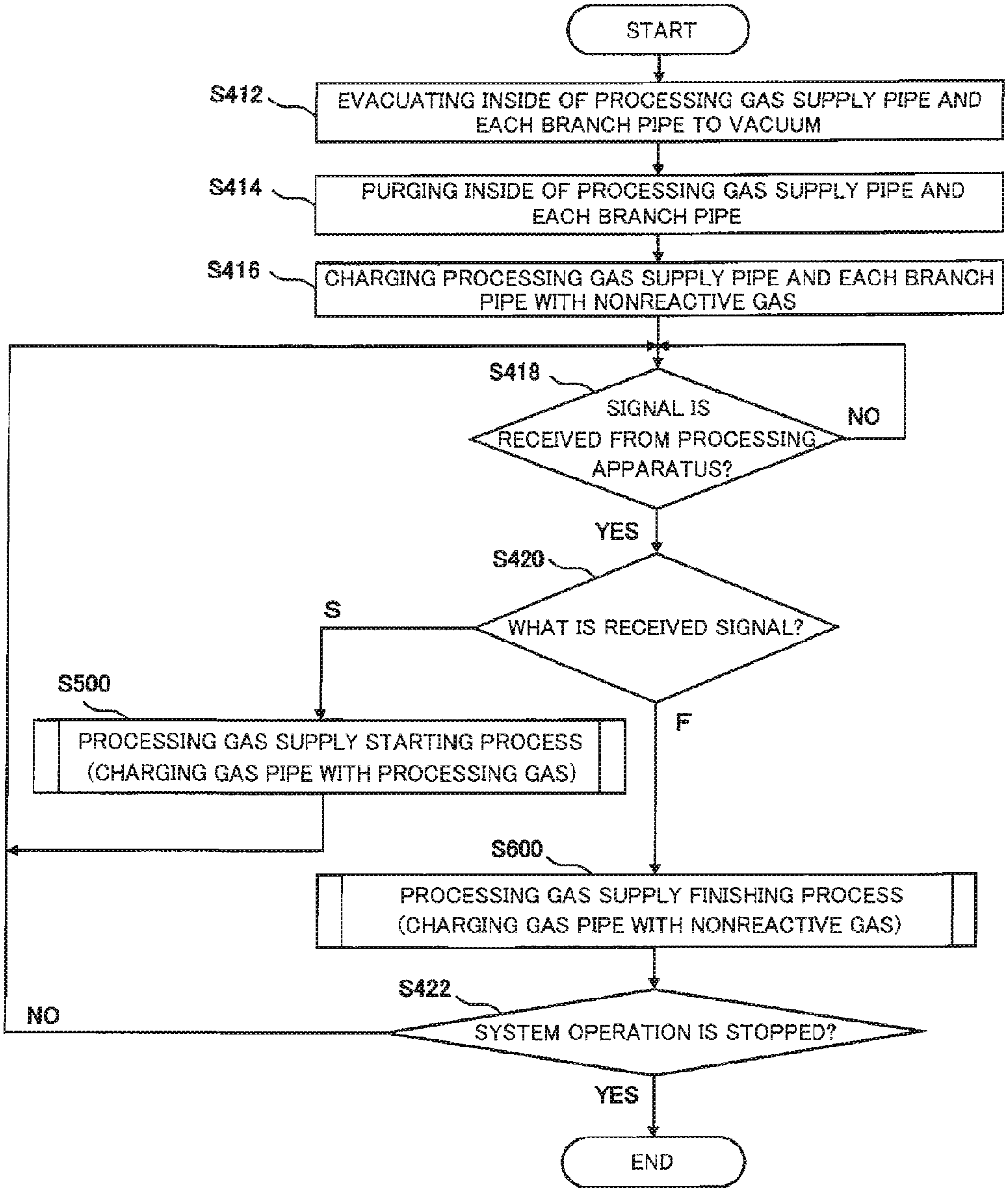
FIG. 9 presents a flowchart to describe an example of a gas supplying process in accordance with the second embodiment of the present invention.

Now, an example of a gas supplying process performed by the processing gas supplying system in accordance with the second embodiment will explained with reference to the accompanying drawing. FIG. 9 sets forth a flowchart to describe the exemplary gas supplying process in accordance with the second embodiment. If the processing gas supplying system is operated, the control unit 310 controls the individual constituent components of the cylinder cabinet (C/C)

200 and the branching box (B/B) 400 based on, for example, a program stored in a storage unit, thereby carrying out the gas supplying process.

In a step S412, the inside of the processing gas supply pipe 220 and the inside of each of the branch pipes 410A to 410D are evacuated to vacuum by the vacuum pump 250. Then, in a step S414, the inside of the processing gas supply pipe 220 and the inside of each of the branch pipes 410A to 410D are purged by a nonreactive gas (for example, a $N_2$ gas) from the nonreactive gas supply source 230. Here, the inside of the processing gas supply pipe 220 is purged by performing the vacuum evacuation by the vacuum pump 250 and the supply of the nonreactive gas plural times. Upon the completion of the purge of the inside of the processing gas supply pipe 220 and the branch pipes 410A to 410D, the processing gas supply pipe 220 and the branch pipes 410A to 410D are charged with the nonreactive gas to a preset pressure degree in a step S416.

In this state, a reception of a signal (a processing gas use start signal S or a processing gas use finish signal F) from the processing apparatus 100 is awaited in a step S418. At, this time, when the processing gas starts to be used by several processing apparatuses 100, the processing gas use start signal S is transmitted to the control unit 310 from the M/C controller 130 of each apparatus. For example, it may be desirable to send the processing gas use start signal S at the moment when a semiconductor wafer is loaded into one processing chamber 110 after the condition thereof is adjusted.

Further, when the use of the processing gas in the several processing apparatuses 100 is completed, the processing gas use finish signal F is transmitted to the control unit 310 from the M/C controller 130. For example, since the gas inlet valves AVIS and AV2S of the gas box 120 are closed to stop the introduction of the processing gas into the processing chamber 110 if the process by the processing gas is completed in the processing chamber 110 of the processing apparatus 100, it may be desirable to transmit the processing gas use finish signal F at this moment.

If the signal from one M/C controller 130 is received by the control unit 310 in the step S418, it is determined whether the signal is a processing gas use start signal S or a processing gas use finish signal. F in a step S420.

If it is determined in the steps S420 that the signal received from the M/C controller 130 is a processing gas use start signal S, a processing gas supply starting process is carried out in a step S500. In the processing gas supply starting process in accordance with the second embodiment, gas pipes currently being used for the supply of the processing gas, among the processing gas supply pipe 220 and the branch pipes 410A to 410D, are evacuated to vacuum and charged with the processing gas to a certain pressure degree, so that the processing gas is ready to be used in a processing apparatus 100 which is a signal transmitting source of the processing gas use start signal S.

In the processing apparatus 100 serving as a signal transmitting source, the gas inlet valves AV1S and AV2S of the gas box 120 are opened under the control of its M/C controller 130, so that the processing gas can be introduced into the processing chamber 110. Then, the processing apparatus 100 serving as a signal transmitting source performs a desired process (for example, an etching process of the semiconductor wafer) by the processing gas for a preset period of time. A control of inner states of the gas pipes by the processing gas supply starting process will be explained later in detail.

Then, if the processing gas supply starting process (step S500) is completed, the process returns back to the step S418 wherein a reception of a signal from any one of the processing apparatuses 100A to 100D is awaited in a standby mode. It is because the M/C controllers 130A to 130D transmit processing gas use start signals S and processing gas use finish signals F to the control unit 310 at different times depending on a process state of each processing apparatus 100 when the plurality of processing apparatuses 100A to 100D perform their own processes, respectively, as in the second embodiment.

Thus, while a processing gas is being supplied in response to a processing gas supply start signal $S_A$ received from, for example, the processing apparatus 100A, another processing gas supply start signal $S_B$ can be received from, for example, the processing apparatus 100B. In such case, the processing gas supply starting process (step S500) is performed continuously.

Further, when a processing gas use start signal S is received from one of the processing apparatuses 100A to 100D during the processing gas supply starting process in accordance with the present embodiment, it is desirable to charge only the gas pipes currently used for the supply of the processing gas with the processing gas according to whether the processing gas is being used in other processing apparatuses at that time, as the inner state of each gas pipe whether it is charged with the processing gas or nonreactive gas) is different depending on whether the processing gas is being used in other processing apparatuses.

For example, in the event that a processing gas use start signal S is received from one processing apparatus and if the other processing apparatuses do not currently use the processing gas, the processing gas supply pipe 220 is not yet charged with the processing gas but is filled with the nonreactive gas. Accordingly, in such case, the branch pipes connected to the processing apparatus serving as a signal transmitting source and the processing gas supply pipe 220 need to be evacuated and then charged with the processing gas.

On the contrary, when a processing gas use finish signal F is received from one processing apparatus and if another processing apparatus is using the processing gas, the processing gas supply pipe 220 is already charged with the processing gas. Accordingly, in such case, only the branch pipes connected to the processing apparatus serving as a signal transmitting source needs to be exhausted and then charged with the processing gas. Thus, since only the gas pipes used for the supply of the processing gas can be charged with the processing gas, it is possible to save the processing gas. Further, since the other gas pipes than those used for the supply of the processing gas are maintained charged with the nonreactive gas, it is possible to prevent a contact between the processing gas and the metal forming the gas pipes, thereby suppressing a deposit generation.

If it is determined in the step S420 that the signal received from one M/C controller 130 is a processing gas use finish signal F, a processing gas supply finishing process is carried out in a step S600. In the processing gas supply finishing process in accordance with the second embodiment, the supply of the processing gas is stopped, and the inside of the gas pipes, which are not currently used for the supply of the processing gas among the processing gas supply pipe 220 and the branch pipes 410A to 410D, are evacuated to vacuum and then charged with the nonreactive gas to a specific pressure level.

When a processing gas use finish signal F is received from one of the processing apparatuses 100A to 100D during the processing gas supply finishing process in accordance with the second embodiment, it is desirable to charge only the gas pipes not used for the supply of the processing gas with the nonreactive gas according to whether the processing gas is being used in other processing apparatuses at that time, as the inner state of each gas pipe (whether it is charged with the processing gas or nonreactive gas is different depending on whether the processing gas is being used in other processing apparatuses.

For example, if another processing apparatus is using the processing gas when the processing gas use finish signal F is received from one processing apparatus, the processing gas in the processing gas supply pipe 220 cannot be exhausted because the processing gas supply pipe 220 is charged with the processing gas and the processing gas is being used. Accordingly, in such case, only the branch pipe connected to the processing apparatus serving as a signal transmitting source is exhausted and charged with the nonreactive gas. Therefore, since only the gas pipes not used for the supply of the processing gas can be charged with the nonreactive gas, it is possible to save the nonreactive gas. Besides, since those gas pipes can be maintained charged with the nonreactive gas, it is possible to prevent a contact between the processing gas and the metal forming the gas pipes, thereby suppressing a deposition generation therein.

On the other hand, if the processing gas is not being used by other processing apparatuses when the processing gas use finish signal F is received from one processing apparatus, the processing gas in the processing gas supply pipe 220 can be immediately exhausted, and the processing gas supply pipe 220 can be charged with the nonreactive gas without raising any problem. Accordingly, in such case, it is possible to supply the nonreactive gas into the branch pipes connected to the processing apparatus serving as a signal transmitting source and into the processing gas supply pipe 220.

As for the above-described processing gas use finishing process (step S600), if the processing gas is not used in the processing apparatus 100, the gas pipes that are not currently used among the processing gas supply pipe 220 and the branch pipes 410A to 410D are always kept charged with the nonreactive gas. Thus, a deposit generation hardly takes place therein during that period. Accordingly, entrance of deposits into the processing chamber 110 can be prevented when the use of the processing gas is resumed later. Further, a control of inner states of the gas pipes by the processing gas use finishing process will be described later in detail.

Subsequently, in a step s422, it is determined whether or not to stop the operation of the processing gas supplying system. If it is decided in the step S422 that the operation will not be stopped, the process returns back to the step S418, whereas if it is determined that the operation will be stopped, the operation is immediately stopped. As described, in the processing gas supply finishing process in accordance with the present embodiment, when the processes of all the processing apparatuses 100A to 100D are completed and in case the inside of the processing gas supply pipe 220 is charged with the nonreactive gas, there arises no problem even if the operation of the processing gas supplying system is immediately stopped. Further, in such case, it may be also desirable to evacuate the inside of the processing gas supply pipe 220 to vacuum and purge it with the nonreactive gas and then to recharge it with the nonreactive gas.

(Detailed Example of Processing Gas Supply Starting Process)

Figure 10:
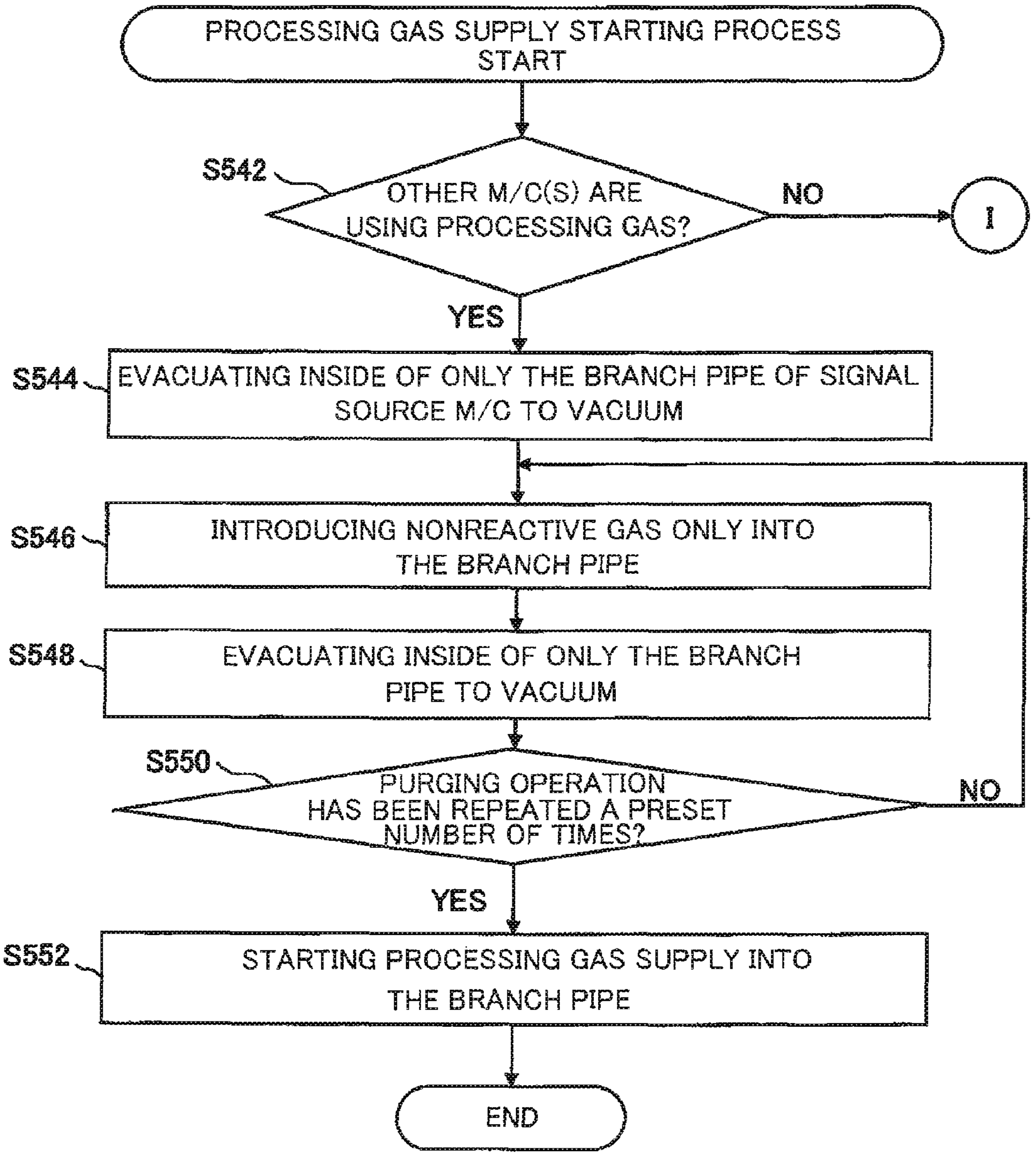

Here, an example of the processing gas supply starting process (step S500) in accordance with the second embodiment will be explained with reference to the accompanying drawings. FIG. 10 provides a flowchart to describe the exemplary processing gas supply starting process in accordance with the second embodiment. First, in a step S542, it is determined whether the processing gas is being used in other processing apparatuses (M/C) than a processing apparatus (M/C) serving as a signal transmitting source from which a processing gas supply starting signal is transmitted.

If it is found in the step S542 that the processing gas is being used in another processing apparatuses (M/C), only the inside of the branch pipes connected to the processing apparatus (M/C) transmitting the processing gas supply start signal S is evacuated to vacuum in a step S544. For example, in the event that only the inside of the branch pipe 410A is exhausted to vacuum, only the air valves AV-V and AV3A shown in FIG. 8 are opened, and then the air valves AV-V and AV3A are closed after a lapse of a certain period of time. Accordingly, the vacuum evacuation of the inside of the branch pipe 410A by the vacuum pump 250 is completed, so that the nonreactive gas in the branch pipe 410A is exhausted.

Subsequently, in steps S546 to S550, the inside of only the evacuated branch pipe is purged. That is, in the step S546, the nonreactive gas (for example, the $N_2$ gas) is introduced into that branch pipe only. For examples in case the nonreactive gas is introduced only into the branch pipe 410A, only the air valve AV2A shown in FIG. 8 is opened, and then closed after a certain period of time elapses. Accordingly, the branch pipe 410A is charged with the nonreactive gas.

Then, the inside of only that branch pipe is evacuated to vacuum in the step S548. A specific process of the step S548 is identical with that of the step S544. Thereafter, it is determined in the step S550 whether the purging operation has been repeated a preset number of times. If it is decided that it has not been performed the preset number of times yet, the purging operation is repeated through the steps S546 to S548. Meanwhile, if it is determined that the purging has already been performed the preset number of times, a supply of the processing gas into the branch pipe is started in a step S552, and the whole processing gas supply starting process is finished. In this case, since the valve CV of the gas cylinder 210 is opened and the processing gas supply pipe 220 is charged with the processing gas, the supply of the processing gas into the processing apparatus can be begun only by opening the air valve of the branch pipe. For example, in the event that the supply of the processing gas only into the branch pipe 410A is started, only the air valve AV1A needs to be opened. Then, by opening the gas inlet valves AV1S and AV2S of the gas box 120, the processing gas can be introduced into the processing chamber 110 of the processing apparatus 100A.

Figure 11:
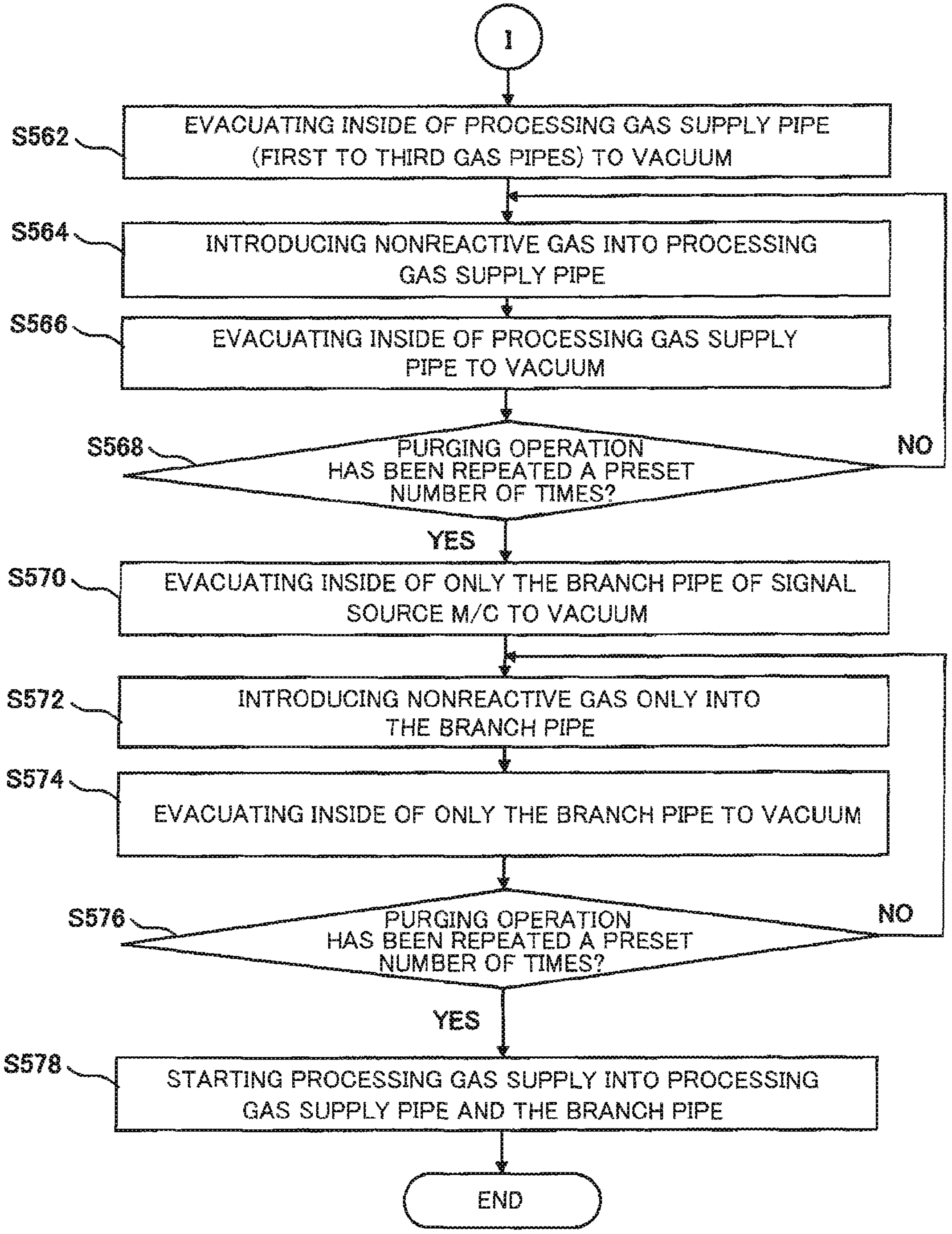
FIG. 11 offers a flowchart to describe an example of the processing gas supply starting process mentioned in FIG. 10 when the processing gas is not used by other processing apparatus(es) (M/C)

If it is determined in the step S542 that the processing gas is not currently used by the other processing apparatuses (M/C), a process in accordance with a flowchart of FIG. 11 is carried out. In such case, since the processing gas supply pipe 220 is charged with the nonreactive gas, not only the branch pipes but also the processing gas supply pipe 220 needs to be evacuated and charged with the processing gas again.

Here, as shown in FIG. 11, in a step S5562, the inside of the processing gas supply pipe 220, that is, the first to the third pipes 222, 294 and 226 are evacuated to vacuum. To elaborate, by opening the air valves AV5 and AV4, the air valves AV7 and AV6 and the air valves AV9 and AV8 shown in FIG. 8, each of the first to the third gas pipes 222, 224 and 226 is evacuated to vacuum by the vacuum pump 250. After a preset time period elapses in this state, the air valves AV5 and AV4, the air valves AV7 and AV6 and the air valves AV9 and AV8 are closed. Accordingly, the vacuum evacuation of the inside of the first to the third pipes 222, 224 and 226 is completed, so that the nonreactive gas therein is exhausted.

Thereafter, a purge of the inside of the processing gas supply pipe 220 is carried out in steps S564 to S568. First, in the step S564, the nonreactive gas (for example, the $N_2$ gas) is introduced into the respective gas pipes of the processing gas supply pipe 220, i.e., the first to the third pipes 222, 224 and 226. Specifically, by first opening the air valve AV-N shown in FIG. 8 and then opening the air valves AV3, AVC1 and AV2 in sequence, the first to the third pipes 222, 224 and 226 are allowed to communicate with the nonreactive gas supply pipe 232, so that the nonreactive gas from the nonreactive gas supply source 230 is introduced into each of the first to the third pipes 222, 224 and 226 via the nonreactive gas supply pipe 232. After a certain time period passes by in this state, the air valves AV2, AV3 and AV10 are closed, and then the air valve AV-N is closed, too. Thus, the introduction of the nonreactive gas into the processing gas supply pipe 220 is completed.

Subsequently, in the step S566, the inside of the processing gas supply pipe 220, i.e., the inside of the first to the third pipes 222, 224 and 226, is evacuated to vacuum. A specific process of the step S566 is identical with that of the step S562. Then, it is determined in the step S568 whether the purging operation has been conducted a preset number of times. If it is found in the step S568 that it has not been performed the preset number of times yet, the purging operation is repeated through the steps S564 and S566. Meanwhile, if it is decided that the purging has already been repeated the preset number of times, only the branch pipe connected to the processing apparatus (M/C) which is the transmission source of the processing gas supply start signal S is evacuated to vacuum in a step S570, and the branch pipe is purged in steps S572 to S576. Specific processes of the steps S570 to S576 are identical with those of the steps S544 to S550 described in FIG. 10, respectively.

If it is found in the step S576 that the purging operation has been repeated a preset number of times, the processing gas starts to be supplied into the processing gas supply pipe 220 and into only the branch pipe in the step S578, and then the whole processing gas supply starting process is finished. That is, C/C supply system valves (the valve CV of the gas cylinder 210 and the air valves AV1 and AV2) are opened, and a B/B supply system valve (that of the branch pipe among the air valves AV1A to AV1D) are opened, so that the processing gas is supplied into the processing gas supply pipe 220 and only that branch pipe to be ready to be used in the processing apparatus (M/C) which is the transmission source of the processing gas supply starting signal S. Then, the whole processing gas supply starting process is terminated.

Thus, the processing apparatus (M/C) serving as a signal transmitting source can introduce the processing gas into the processing chamber 110 only by opening the gas inlet valves AVIS and AV2S of the gas box 120. Further, in accordance with the process described in FIG. 1, when exhausting the nonreactive gas from both of the gas supply pipe and the branch pipes, the gas supply pipe on the side of the processing gas supply source is first evacuated to vacuum while the branch pipes on the side of the processing apparatus are still charged with the nonreactive gas. Thus, it is possible to evacuate the gas pipes effectively without affecting gas pipes on the processing apparatus side. Furthermore, by performing the purging operation, in which the introduction of the nonreactive gas into the gas pipes and the vacuum evacuation thereof are repeated multiple times, prior to charging the gas pipes with the processing gas, residual gases or impurities in the gas pipes can be removed completely.

(Detailed Example of Processing Gas Supply Finishing Process)

Figure 12:
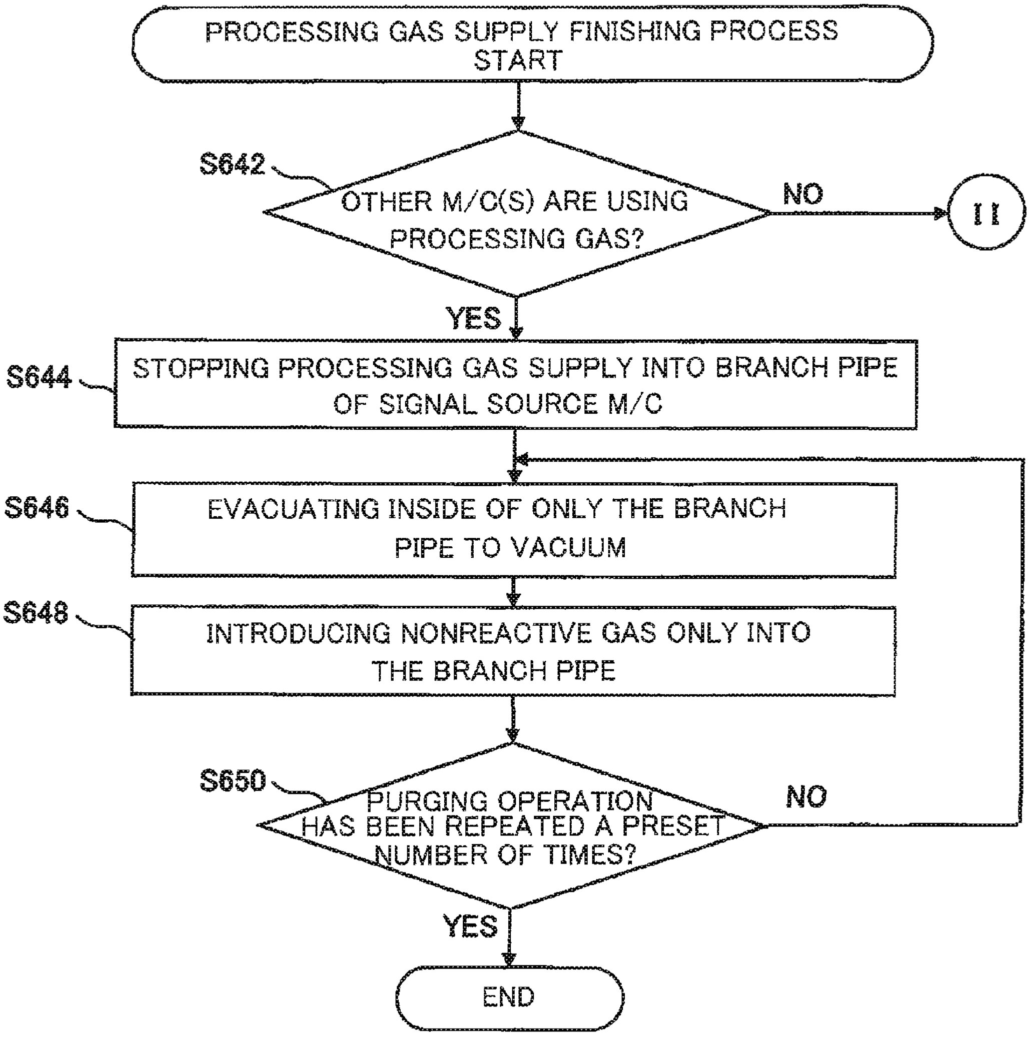
FIG. 12 sets forth a flowchart to describe an example of a processing gas supply finishing process shown in FIG. 9.

Below, an example of the processing gas supply finishing process (step S600) in accordance with the second embodiment will be explained with reference to the accompanying drawings. FIG. 12 presents a flowchart to describe the exemplary processing gas supply finishing process in accordance with the second embodiment. First, in a step S642, it is determined whether other processing apparatuses (M/C) than the one that has transmitted a processing gas supply finish signal F are using the processing gas.

If it is determined in the step S642 that another processing apparatus (M/J) is using the processing gas, only the supply of the processing gas into the branch pipe connected to the processing apparatus (M/C) transmitting the processing gas supply finish signal 7 is stopped in a step S644, as the processing gas supply pipe 220 is already charged with the processing gas and the processing gas is being used in another processing apparatus. Specifically, among the air valves AV1A to AV1D, only the air valve of the branch pipe connected to the processing apparatus (M/C) serving as a signal transmitting source is closed, whereby the supply of the processing gas from the processing gas supply pipe 220 can be stopped.

Subsequently, in steps S646 to S648, a purge of the branch pipe is carried out, and then it is charged with a nonreactive gas (for example, a $N_2$ gas). That is, only the inside of the branch pipe is evacuated to vacuum in the step S646, and the nonreactive gas is introduced into that branch pipe in the step S648. These steps S646 and S648 are identical with the steps S548 and S546 described in FIG. 10, respectively.

Then, it is determined in a step S650 whether the purging operation has been repeated a preset number of times. If it is found that the purging operation has not been performed the preset number of times, the purging operation is repeated through the steps S646 and S648. Meanwhile, if it is found that the purging operation has been repeated the preset number of times in the step S650, the whole processing gas supply finishing process is terminated immediately. As a result, the processing gas only in the branch pipe is exhausted, and then the branch pipe is charged with the nonreactive gas instead.

Figure 13:
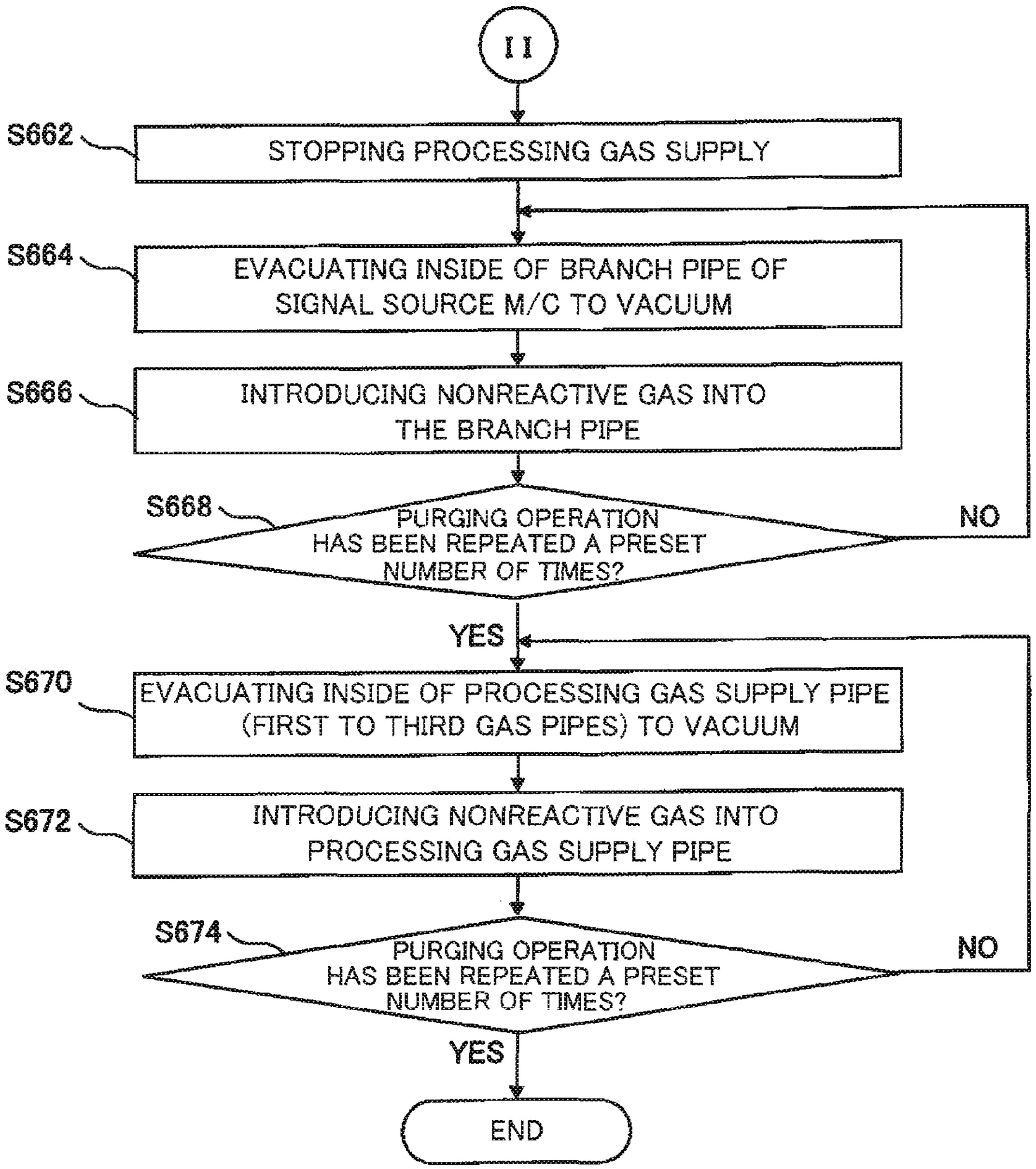
FIG. 13 depicts a flowchart to describe an example of a processing gas supply starting process shown in FIG. 9.

If it is found in the step S642 that any other processing apparatus (M/C) is not using the processing gas, a process following a flowchart of FIG. 13 is carried out. In such case, since only the processing apparatus that has sent the processing gas supply finishing signal F is using the processing gas, the supply of the processing gas into the processing gas supply pipe 220 as well as the branch pipe of the processing apparatus can be stopped.

Here, as shown in FIG. 13, the B/B supply system valve the valve of the branch pipe among the air valves AV1A to AV1D, is first closed and the C/C supply system valves (the valve CV of the gas cylinder 210, the air valves AV1 and AV2) are closed in the step S662, so that the supply of the processing gas from the gas cylinder 210 is stopped.

Subsequently, in steps S664 to S666, a purge of the branch pipe is carried out, and the branch pipe is charged with a nonreactive gas (for example, a $N_2$ gas). That is, only the inside of the branch pipe is evacuated to vacuum in the step S664, and the nonreactive gas is introduced into the branch pipe only in the step S666. These steps S664 and S666 are identical with the steps S646 and S648 described in FIG. 12, respectively.

Then, it is determined in a step 366S whether the purging operation has been repeated a preset number of times. If it is found that the purging operation has not been performed the preset number of times yet, the purging operation through the steps S664 and S666 is repeated. As a result, the processing gas only in the branch pipe is exhausted, and then the branch pipe is charged with the nonreactive gas instead.

Meanwhile, if it is found in the step S668 that the purging operation has been repeated the preset number of times, the processing gas supply pipe 220, i.e., the first to the third pipes 222, 224 and 226, is purged and charged with the nonreactive gas in steps S670 to S672. The steps S670 and S672 are identical with the steps S566 and S564 described in FIG. 11.

Then, in a step S674, it is determined whether the purging operation through the steps S670 and S672 has been repeated a preset number of times. If it is decided that the purging operation has not been repeated the preset number of times, the purging operation through the steps S670 and S672 is repeated, and then the whole processing gas supply finishing process is terminated immediately.

As a result, the processing gas is exhausted from the processing gas supply pipe 220, and the processing gas supply pipe 220 is charged with the nonreactive gas instead. Thus, since the processing gas supply pipe 220 is kept charged with the nonreactive gas until a next processing gas use start signal S is received, a deposit generation in the processing gas supply pipe 220 due to a reaction between the processing gas and the metal forming the gas pipe hardly occurs during that period.

Furthermore, when exhausting the processing gas from both of the gas supply pipe and the branch pipes, the branch pipe on the side of the processing apparatus is first evacuated to vacuum, so that the processing gas in the gas pipe closer to the processing apparatus can be exhausted earlier. Further, by performing the purging operation, in which the vacuum evacuation of the gas pipe and the introduction of the nonreactive gas thereinto are repeated plural times in sequence prior to charging that gas pipe with the nonreactive gas, residual gases or impurities inside the gas pipe can be removed completely.

Figure 14:
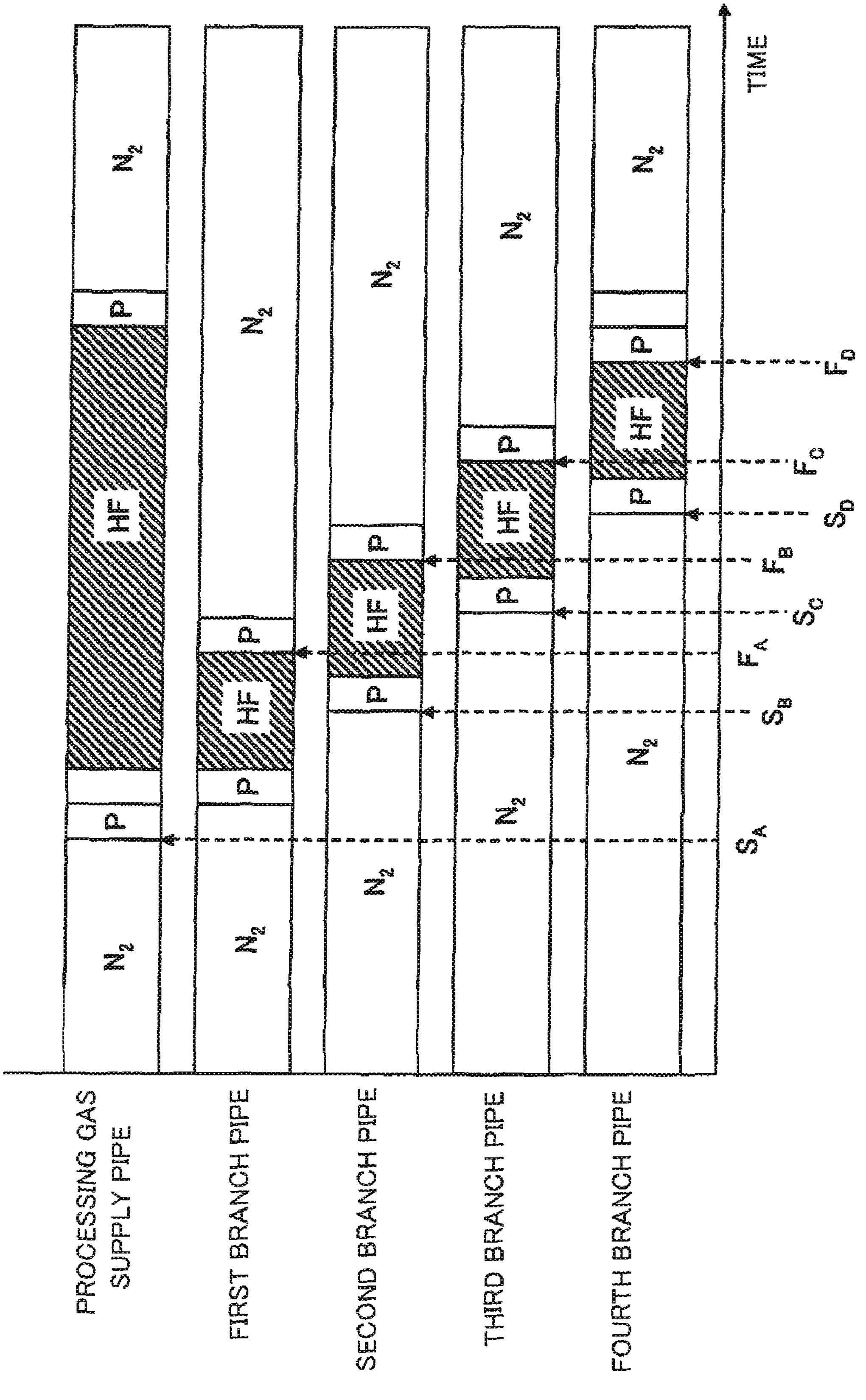
FIG. 14 shows a diagram for describing an inner state of each gas pipe in accordance with the second embodiment of the present invention.

Inner states of the gas pipes by the gas supplying method in accordance with the above-described second embodiment are as shown in FIG. 14, for example. That is, the processing gas supply pipe 220 and the first to the fourth branch pipe 410A to 410D are usually kept charged with the nonreactive gas (for example, the $N_2$ gas) in a standby state. Then, if a processing gas supply start signal $S_A$ is received from the processing apparatus 100A, for example, the steps S562 to S578 described in FIG. 11 are carried out. That is, after performing vacuum evacuation and purge (P) of the inside of the processing gas supply pipe 220 (the first to the third pipes 222, 224 and 226), vacuum evacuation and purge (P) of the inside of the first branch pipe 410A is conducted. Then, by opening the valve CV of the gas cylinder 210, the processing gas (for example, the HF gas) is supplied into the processing gas supply pipe 220 and into the first branch pipe 410A to a certain pressure degree to be ready to be used when necessary.

In this state, if a processing gas use start signal $S_B$ is received from the processing apparatus 100B, the steps S544 to S552 described in FIG. 10 are carried out. That is, vacuum evacuation and purge (P) of the inside of the second branch pipe 410B is carried out, and by allowing the second branch pipe 410B to communicate with the processing gas supply pipe 220 by opening the air valve AV1B of the second branch pipe 410B, the processing gas (for example, the HF gas) is introduced into the second branch pipe 410B to a certain pressure degree to be ready to be used.

Subsequently, if a processing gas use finish signal F is received from the processing apparatus 100A, the steps S644 to S650 illustrated in FIG. 12 are carried out. That is, the air valve AV1A of the first branch pipe 410A is closed to stop the supply of the processing gas from the processing gas supply pipe 220. Then, vacuum evacuation and purge (P) of the first branch pipe 410A is conducted, and then the first branch pipe 410A is charged with the nonreactive gas to a specific pressure degree.

Afterwards, whenever a processing gas use start signal S is received, the steps S544 to S552 illustrated in FIG. 10 are carried out, and whenever a processing gas use finish signal F is received, the steps S644 to S650 described in FIG. 12 are executed. Thus, only the branch pipe of the processing apparatus that has transmitted those signals is charged with the processing gas or the nonreactive gas while the processing gas is being used by other processing apparatuses.

If a processing gas use finish signal $F_A$ is received from the processing apparatus 100D in a state the other processing apparatuses (100A to 100C) are not using the processing gas but only the processing apparatus 100D is using the processing gas, the steps S662 to S672 described in FIG. 13 are carried out. That is, by closing the valve CV of the gas cylinder 210, the supply of the processing gas is stopped. Then, after performing the vacuum evacuation and purge (P) of the inside of the fourth branch pipe 410D, vacuum evacuation and purge (P) of the processing gas supply pipe 220 the first to the third pipes 222, 224 and 226) is carried out, and the nonreactive gas is supplied into the processing gas supply pipe 220 and the fourth branch pipe 410D to a specific pressure degree.

Through the described process, it is possible to charge, with the processing gas, the processing gas supply pipe 220 and a part of the first to the fourth branch pipes 410A and 410D currently used for the supply of the processing gas only when the processing gas is being used by the processing apparatus 100. Accordingly, while the processing apparatus 190 is not using the processing gas, the processing gas supply pipe 220 and the branch pipes, which are not used, can be maintained charged with the nonreactive gas. Thus, a deposit generation in the processing gas supply pipe 220 does not takes place during that period, and entrance of deposits into the processing chamber 110 of each of the processing apparatuses 100A to 100D can be prevented when the processing gas is used later again.

Moreover, in comparison with a case of charging both of the processing gas supply pipe 220 and the first to the fourth branch pipes 410A to 410D with the processing gas all the time, a contact time between the processing gas and the metal inside the gas pipes can be remarkably reduced, so that a reaction therebetween can be suppressed greatly in comparison with conventional cases.

Furthermore, when the present invention is applied, a higher effect can be obtained if a gas having a high reactivity with the metal forming the gas pipes (reactive gas) is used as a processing gas. In this aspect, the first and second embodiments have been described for the case of using, for example, the HF gas as the processing gas having a high reactivity with the metal forming the gas pipes, but the processing gas is not limited thereto. Further, though the $N_2$ gas is used as the nonreactive gas in the above embodiments, the nonreactive gas is not limited thereto, either. For example, an Ar gas can be used instead.

While the invention has been shown and described with respect to the embodiments with reference to the accompanying drawings, the present invention is not limited thereto, and it would be understood by those skilled in the art that various changes and modification may be made without departing from the scope of the invention as defined in the following claims. It shall be understood that all the modifications and embodiments conceived from the meaning and scope of the claims and their equivalents are included in the scope of the present invention.

INDUSTRIAL APPLICABILITY

The present invention has many advantages when it is applied to a processing gas supplying system and a processing gas supplying method.

The invention claimed is:

1. A gas supplying system for supplying a processing gas to a processing apparatus, comprising:

a processing gas supply source for supplying the processing gas;

a gas supply pipe for supplying the processing gas from the processing gas supply source into the processing apparatus;

a nonreactive gas supply source for supplying a nonreactive gas into the gas supply pipe;

a vacuum evacuation unit for evacuating the inside of the gas supply pipe to vacuum; and a control unit for receiving a signal from the processing apparatus and controlling an inner state of the gas supply pipe in response to the received signal, wherein the control unit keeps the gas supply pipe charged with the nonreactive gas to be in a standby state while the system is in operation;

the control unit exhausts, if a processing gas use start signal is received from the processing apparatus, the nonreactive gas from the gas supply pipe to create a vacuum therein by the vacuum evacuation unit, charges the gas supply pipe with the processing gas, and starts a supply of the processing gas from the processing gas supply source; and the control unit stops, if a processing gas use finish signal is received from the processing apparatus, the supply of the processing gas from the processing gas supply source, exhausts the processing gas from the gas supply pipe to create a vacuum therein by the vacuum evacuation unit, and charges the gas supply pipe with the nonreactive gas.

2. The gas supplying system of claim 1, wherein the gas supply pipe is branched into a primary pipe on the side of the processing gas supply source and a secondary pipe on the side of the processing apparatus;

when charging the gas supply pipe with the processing gas, the control unit first exhausts the nonreactive gas from the primary pipe by evacuating the primary pipe to vacuum, then exhausts the nonreactive gas from the secondary pipe by evacuating the secondary pipe to vacuum, and then charges the primary and secondary pipes with the processing gas; and when charging the gas supply pipe with the nonreactive gas, the control unit first exhausts the processing gas from the secondary pipe by evacuating the secondary pipe to vacuum, then exhausts the processing gas from the primary pipe by evacuating the primary pipe to vacuum, and then charges the primary and secondary pipes with the nonreactive gas.

3. The gas supplying system of claim 1, wherein, after the nonreactive gas is exhausted from the gas supply pipe to create the vacuum therein, the control unit performs a purge of the gas supply pipe by repeating an introduction of the nonreactive gas into the gas supply pipe and a vacuum evacuation thereof plural times in sequence before the gas supply pipe is charged with the processing gas; and after the processing gas is exhausted from the gas supply pipe to create the vacuum therein, the control unit performs a purge of the gas supply pipe by repeating a vacuum evacuation of the gas supply pipe and an introduction of the nonreactive gas thereinto plural times in sequence before the gas supply pipe is charged with the nonreactive gas.

4. The gas supplying system of claim 1, wherein the processing gas is a HF gas.

5. A gas supplying method of a gas supplying system for supplying a processing gas to a processing apparatus, the gas supplying system including a processing gas supply source for supplying the processing gas; a gas supply pipe for supplying the processing gas from the processing gas supply source into the processing apparatus; a nonreactive gas supply source for supplying a nonreactive gas into the gas supply pipe; a vacuum evacuation unit for evacuating the inside of the gas supply pipe to vacuum; and a control unit for receiving a signal from the processing apparatus and controlling an inner state of the gas supply pipe in response to the received signal, the method comprising:

keeping the gas supply pipe charged with the nonreactive gas to be in a standby state while the system is in operation;

exhausting, if the control unit receives a processing gas use start signal from the processing apparatus, the nonreactive gas from the gas supply pipe to create a vacuum therein by the vacuum evacuation unit, charging the gas supply pipe with the processing gas supplied from the processing gas supply source, and then starting a supply of the processing gas from the processing gas supply source; and stopping, if the control unit receives a processing gas use finish signal from the processing apparatus, the supply of the processing gas from the processing gas supply source, exhausting the processing gas from the gas supply pipe to create a vacuum therein by the vacuum evacuation unit, and then charging the gas supply pipe with the nonreactive gas supplied from the nonreactive gas supply source.

6. The gas supplying method of claim 5, wherein the gas supply pipe is branched into a primary pipe on the side of the processing gas supply source and a secondary pipe on the side of the processing apparatus, and when charging the gas supply pipe with the processing gas, the control unit exhausts the primary pipe and the secondary pipe to vacuum in sequence, and then charges the primary and secondary pipes with the processing gas, and when charging the gas supply pipe with the nonreactive gas, the control unit exhausts the secondary pipe and the primary pipe to vacuum in sequence, and then charging the primary and secondary pipes with the nonreactive gas.

7. The gas supplying method of claim 5, wherein, after the nonreactive gas is exhausted from the gas supply pipe to create the vacuum therein, the control unit performs a purge of the gas supply pipe by repeating an introduction of the nonreactive gas into the gas supply pipe and a vacuum evacuation thereof plural times in sequence before the gas pipe is charged with the processing gas; and after the processing gas is exhausted from the gas supply pipe to create the vacuum therein, the control unit performs a purge of the gas supply pipe by repeating a vacuum evacuation of the gas supply pipe and an introduction of the nonreactive gas thereinto plural times in sequence before the gas supply pipe is charged with the nonreactive gas.

8. The gas supplying method of claim 5, wherein the processing gas is a HF gas and the nonreactive gas is a N2 gas.

9. A gas supplying system for supplying a processing gas to a plurality of processing apparatuses, respectively, comprising:

a processing gas supply source for supplying the processing gas;

- a gas supply pipe connected to the processing gas supply source;
- a multiplicity of branch pipes for splitting the processing gas from the gas supply pipe to supply the processing gas into the plurality of processing apparatuses, respectively;
- a nonreactive gas supply source for supplying a nonreactive gas into the gas supply pipe and the multiplicity of branch pipes;
- a vacuum evacuation unit for exhausting the gas supply pipe and the multiplicity of branch pipes to vacuum; and
- a control unit for receiving a signal from the processing apparatus and controlling inner states of the gas supply pipe and the multiplicity of branch pipes in response to the received signal,
- wherein the control unit keeps the gas supply pipe and the multiplicity of branch pipes charged with the nonreactive gas to be in a standby state while the system is in operation;
- the control unit exhausts, if a processing gas use start signal is received from the processing apparatus, the nonreactive gas from the gas supply pipe and a part of the branch pipes currently being used to create a vacuum therein by the vacuum evacuation unit, then charges the gas supply pipe and the part of the branch pipes with the processing gas, and then starts a supply of the processing gas; and
- the control unit stops, if a processing gas use finish signal is received from the processing apparatus, the supply of the processing gas; then exhausts the processing gas from the gas supply pipe and a portion of the branch pipes not to be used to create a vacuum therein by the vacuum evacuation unit; and then charges the gas supply pipe and the portion of the branch pipes with the nonreactive gas.

10. The gas supplying system of claim 9, wherein, when the processing gas supply start signal is received from the processing apparatus, the control unit determines whether other processing apparatus(es) than the processing apparatus that has transmitted the processing gas supply start signal is using the processing gas, and

- if it is determined that said other processing apparatus(es) is using the processing gas, only the branch pipe connected to the processing apparatus serving as the signal transmitting source is evacuated to vacuum by exhausting the nonreactive gas therein and is charged with the processing gas, and a supply of the processing gas from the gas supply pipe is started,
- whereas if it is determined that said other processing apparatus(es) is not using the processing gas, the gas supply pipe and the branch pipe connected to the processing apparatus serving as the signal transmitting source is evacuated to vacuum by exhausting the nonreactive gas therein and is charged with the processing gas, and a supply of the processing gas from the processing gas supply source is started.

11. The gas supplying system of claim 10, wherein, when charging both of the gas supply pipe and the branch pipe with the processing gas, the control unit evacuates the gas supply pipe and the branch pipe to vacuum in sequence, and charges both of the gas supply pipe and the branch pipe with the processing gas.

12. The gas supplying system of claim 9, wherein, when the processing gas use finish signal is received from the processing apparatus, the control unit determines whether other processing apparatus(es) than the processing apparatus that has transmitted the processing gas use finish signal is using the processing gas and

- if it is determined that said other processing apparatus(es) is using the processing gas, the supply of the processing gas from the gas supply pipe is stopped, and only the branch pipe connected to the processing apparatus serving as the signal transmitting source is evacuated to vacuum by exhausting the processing gas therein and is charged with the nonreactive gas,
- whereas if it is determined that said other processing apparatus(es) is not using the processing gas, the supply of the processing gas from the processing gas supply source is stopped, and the gas supply pipe and the branch pipe connected to the processing apparatus serving as the signal transmitting source are evacuated by exhausting the processing gas therein and are charged with the nonreactive gas.

13. The gas supplying system of claim 12, wherein, when charging both of the gas supply pipe and the branch pipe with the nonreactive gas, the control unit evacuates the branch pipe and the gas supply pipe to vacuum in sequence, and charges both of the gas supply pipe and the branch pipe with the nonreactive gas.

14. The gas supplying system of claim 9, wherein, after the nonreactive gas in the part of the pipes being used is exhausted to create a vacuum therein, the control unit performs a purge of the part of the pipes by repeating an introduction of the nonreactive gas into the part of the pipes and a vacuum evacuation thereof plural times in sequence before the part of the pipes are charged with the processing gas; and

- after the processing gas in the portion of the gas pipes not to be used is exhausted to create a vacuum therein, the control unit performs a purge of the portion of the gas pipes by repeating a vacuum evacuation of the portion of the gas pipes and an introduction of the nonreactive gas thereinto plural times in sequence before the portion of the gas pipes are charged with the nonreactive gas.

15. The gas supplying system of claim 9, wherein the processing gas is a HF gas, and the nonreactive gas is a N2 gas.

16. A gas supplying method of a gas supplying system for supplying a processing gas to a plurality of processing apparatuses, respectively, the gas supplying system including a processing gas supply source for supplying the processing gas; a gas supply pipe connected to the processing gas supply source; a multiplicity of branch pipes for splitting the processing gas from the gas supply pipe to supply the processing gas into the plurality of processing apparatuses, respectively; a nonreactive gas supply source for supplying a nonreactive gas into the gas supply pipe and the multiplicity of branch pipes; a vacuum evacuation unit for exhausting the gas supply pipe and the multiplicity of branch pipes to vacuum; and a control unit for receiving a signal from the processing apparatus and controlling inner states of the gas supply pipe and the multiplicity of branch pipes in response to the received signal, the method comprising:

- keeping the gas supply pipe and the multiplicity of branch pipes charged with the nonreactive gas to be in a standby state while the system is in operation;
- exhausting, if the control unit receives a processing gas use start signal from the processing apparatus, the nonreactive gas from the gas supply pipe and a part of the branch pipes currently being used to create a vacuum therein by the vacuum evacuation unit, then charging the gas supply pipe and the part of the branch pipes with the processing gas, and then starting a supply of the processing gas; and
- stopping, if a processing gas use finish signal is received from the processing apparatus, the supply of the processing gas; exhausting the processing gas from the gas supply pipe and a portion of the branch pipes not to be used to create a vacuum therein by the vacuum evacuation unit; and then charging the gas supply pipe and the portion of the branch pipes with the nonreactive gas.

17. The gas supplying method of claim 16, further comprising:

determining, if the control unit receives the processing gas use start signal from the processing apparatus, whether other processing apparatus(es) than the processing apparatus that has transmitted the processing gas supply start signal is using the processing gas;

evacuating, if it is determined that said other processing apparatus(es) is using the processing gas, only the branch pipe connected to the processing apparatus serving as the signal transmitting source to vacuum by exhausting the nonreactive gas therein, charging said branch pipe with the processing gas, and then starting a supply of the processing gas from the gas supply pipe;

evacuating, if it is determined that said other processing apparatus(es) is not using the processing gas, the gas supply pipe and the branch pipe connected to the processing apparatus serving as the signal transmitting source to vacuum by exhausting the nonreactive gas therein, charging the gas supply pipe and said branch pipe with the processing gas, and then starting a supply of the processing gas from the processing gas supply source.

18. The gas supplying method of claim 17, wherein when charging both of the gas supply pipe and the branch pipe with the processing gas, the gas supply pipe is first evacuated to vacuum and then the branch pipe is evacuated to vacuum, and both of the gas supply pipe and the branch pipe are charged with the processing gas.

19. The gas supplying method of claim 16, further comprising:

determining, if the processing gas use finish signal is received from the processing apparatus, whether other processing apparatus(es) than the processing apparatus that has transmitted the processing gas use finish signal is using the processing gas;

stopping, if it is determined that said other processing apparatus(es) is using the processing gas, the supply of the processing gas from the gas supply pipe, evacuating only the branch pipe connected to the processing apparatus serving as the signal transmitting source to vacuum by exhausting the processing gas therein, and then charging said branch pipe with the nonreactive gas; and stopping, if it is determined that said other processing apparatus(es) is not using the processing gas, the supply of the processing gas from the processing gas supply source, evacuating the gas supply pipe and the branch pipe connected to the processing apparatus serving as the signal transmitting source to vacuum by exhausting the processing gas therein, and then charging the gas supply pipe and said branch pipe with the nonreactive gas.

20. The gas supplying method of claim 19, wherein, when charging both of the gas supply pipe and the branch pipe with the nonreactive gas, the branch pipe is first evacuated to vacuum and then the gas supply pipe is evacuated to vacuum, and both of the gas supply pipe and the branch pipe are charged with the nonreactive gas.

21. The gas supplying method of claim 16, wherein, after the nonreactive gas in the part of the pipes being used is exhausted to create a vacuum therein, a purge of the pipes is performed by repeating an introduction of the nonreactive gas into the pipes and a vacuum evacuation thereof plural times in sequence before the pipes are charged with the processing gas; and, after the processing gas is exhausted from the portion of the pipes not to be used to create a vacuum therein, a purge of the pipes is performed by repeating a vacuum evacuation of the pipes and an introduction of the nonreactive gas thereinto plural times in sequence before the pipes are charged with the nonreactive gas.

22. The gas supplying method of claim 16, wherein the processing gas is a HF gas, and the nonreactive gas is a N2 gas.

* * * * *

UNITED STATES PATENT AND TRADEMARK OFFICE

CERTIFICATE OF CORRECTION

PATENT NO. : 8,261,762 B2
APPLICATION NO. : 12/093491
DATED : September 11, 2012
INVENTOR(S) : Kiyoshi Komiyama et al.

It is certified that error appears in the above-identified patent and that said Letters Patent is hereby corrected as shown below:

In the Specifications:

In column 7, line 56, delete "13" and insert --10--

In column 9, line 20, delete "10" and insert --100--

In column 9, line 26, delete "292" and insert --222--

In column 10, line 37, delete "24Q" and insert --240--

In column 11, line 16, delete "11" and insert --110--

In column 12, line 22, delete "N)" and insert --$N_2$--

In column 12, line 26, delete "AVON" and insert --AV-N--

In column 15, line 6, delete "100" and insert --100D--

In column 15, line 26, delete "413A" and insert --410A--

In column 16, line 30, delete "310n" and insert --310--

In column 20, line 51, delete "S5562" and insert --S562--

In column 20, line 53, delete "294" and insert --224--

In column 21, line 2, delete "AVC1" and insert --AV10--

In column 21, line 48, delete "1" and insert --11--

In column 22, line 6, delete "J" and insert --C--

In column 22, line 9, delete "7" and insert --F--

In column 22, line 57, delete "366S" and insert --S668--

In column 24, line 26, delete "190" and insert --100--

Signed and Sealed this
Twentieth Day of August, 2013

Teresa Stanek Rea
*Acting Director of the United States Patent and Trademark Office*